(12) United States Patent
Chiron

(10) Patent No.: US 9,178,627 B2
(45) Date of Patent: Nov. 3, 2015

(54) RUGGED IQ RECEIVER BASED RF GAIN MEASUREMENTS

(75) Inventor: Jean-Frederic Chiron, Tournefeuille (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/122,852

(22) PCT Filed: May 31, 2012

(86) PCT No.: PCT/US2012/040317
§ 371 (c)(1),
(2), (4) Date: Nov. 27, 2013

(87) PCT Pub. No.: WO2012/166992
PCT Pub. Date: Dec. 6, 2012

(65) Prior Publication Data
US 2014/0099907 A1    Apr. 10, 2014

Related U.S. Application Data

(60) Provisional application No. 61/491,416, filed on May 31, 2011.

(51) Int. Cl.
*H03C 1/62* (2006.01)
*H04B 17/00* (2015.01)
(Continued)

(52) U.S. Cl.
CPC ............ *H04B 17/0005* (2013.01); *H03F 3/195* (2013.01); *H03F 3/245* (2013.01);
(Continued)

(58) Field of Classification Search
USPC .......... 455/114.3, 115.1, 115.2; 375/296, 297
See application file for complete search history.

(56) References Cited

U.S. PATENT DOCUMENTS

| 3,969,682 A | 7/1976 | Rossum |
| 3,980,964 A | 9/1976 | Grodinsky |

(Continued)

FOREIGN PATENT DOCUMENTS

| CN | 1211355 A | 3/1999 |
| CN | 1518209 A | 8/2004 |

(Continued)

OTHER PUBLICATIONS

Notice of Allowance for U.S. Appl. No. 13/661,552, mailed Jun. 13, 2014, 5 pages.

(Continued)

*Primary Examiner* — Nguyen Vo
(74) *Attorney, Agent, or Firm* — Withrow & Terranova, P.L.L.C.

(57) ABSTRACT

A method and apparatus for measuring a complex gain of a transmit path are disclosed. During a test mode, an IQ to radio frequency modulator modulates a quadrature RF carrier signal using a quadrature test signal. An RF to IQ down-converter down-converts a down-converter RF input signal to provide a quadrature down-converter output signal using the quadrature RF carrier signal. The down-converter RF input signal is based on the quadrature test signal and the gain of the transmit path. A digital frequency converter frequency converts the quadrature down-converter output signal, providing an averaged frequency converter output signal, which is a quadrature direct current signal representative of an amplitude of the quadrature test signal and the gain of the transmit path. Therefore, a measured gain of the transmit path is based on the amplitude of the quadrature test signal and averaged frequency converter output signal.

20 Claims, 13 Drawing Sheets

(51) Int. Cl.
  *H03F 3/195* (2006.01)
  *H03F 3/24* (2006.01)
  *H04B 17/11* (2015.01)
  *H04B 1/04* (2006.01)

(52) U.S. Cl.
  CPC ......... *H04B 17/11* (2013.01); *H03F 2200/204* (2013.01); *H03F 2200/207* (2013.01); *H03F 2200/336* (2013.01); *H03F 2200/408* (2013.01); *H04B 2001/0433* (2013.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 * | 6/2002 | Gourgue et al. .............. 375/296 |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,856,048 B1 * | 12/2010 | Smaini et al. .............. 375/221 |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |

(56) References Cited

U.S. PATENT DOCUMENTS

| | | |
|---|---|---|
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,717,100 B2 | 5/2014 | Reisner et al. |
| 8,718,582 B2 | 5/2014 | See et al. |
| 8,744,382 B2 | 6/2014 | Hou et al. |
| 8,824,978 B2 | 9/2014 | Briffa et al. |
| 8,829,993 B2 | 9/2014 | Briffa et al. |
| 8,909,175 B1 | 12/2014 | McCallister |
| 8,947,162 B2 | 2/2015 | Wimpenny et al. |
| 8,981,847 B2 | 3/2015 | Balteanu |
| 8,994,345 B2 | 3/2015 | Wilson |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1* | 7/2006 | Eyries et al. ............... 455/296 |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0184794 A1 | 8/2007 | Drogi et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagi |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

(56) References Cited

U.S. PATENT DOCUMENTS

| | | | |
|---|---|---|---|
| 2014/0028370 | A1 | 1/2014 | Wimpenny |
| 2014/0028392 | A1 | 1/2014 | Wimpenny |

FOREIGN PATENT DOCUMENTS

| | | | |
|---|---|---|---|
| CN | 1898860 | A | 1/2007 |
| CN | 101201891 | A | 6/2008 |
| CN | 101379695 | A | 3/2009 |
| CN | 101416385 | A | 4/2009 |
| CN | 101427459 | A | 5/2009 |
| CN | 101626355 | A | 1/2010 |
| CN | 101635697 | A | 1/2010 |
| CN | 101867284 | A | 10/2010 |
| EP | 0755121 | A2 | 1/1997 |
| EP | 1317105 | A1 | 6/2003 |
| EP | 1492227 | A1 | 12/2004 |
| EP | 1557955 | A1 | 7/2005 |
| EP | 1569330 | A1 | 8/2005 |
| EP | 2214304 | A1 | 8/2010 |
| EP | 2244366 | A1 | 10/2010 |
| EP | 2372904 | A1 | 10/2011 |
| EP | 2579456 | A1 | 4/2013 |
| GB | 2398648 | A | 8/2004 |
| GB | 2462204 | A | 2/2010 |
| GB | 2465552 | A | 5/2010 |
| GB | 2484475 | A | 4/2012 |
| TW | 461168 | B | 10/2001 |
| WO | 0048306 | A1 | 8/2000 |
| WO | 2004002006 | A1 | 12/2003 |
| WO | 2004082135 | A2 | 9/2004 |
| WO | 2005013084 | A2 | 2/2005 |
| WO | 2006021774 | A1 | 3/2006 |
| WO | 2006070319 | A1 | 7/2006 |
| WO | 2006073208 | A1 | 7/2006 |
| WO | 2007107919 | A1 | 9/2007 |
| WO | 2007149346 | A2 | 12/2007 |
| WO | 2012151594 | A2 | 11/2012 |
| WO | 2012172544 | A1 | 12/2012 |

OTHER PUBLICATIONS

International Search Report and Written Opinion for PCT/US2012/062110, issued Apr. 8, 2014, 12 pages.

International Preliminary Report on Patentability for PCT/US2012/062110, mailed May 8, 2014, 9 pages.

Non-Final Office Action for U.S. Appl. No. 13/692,084, mailed Apr. 10, 2014, 6 pages.

Notice of Allowance for U.S. Appl. No. 13/692,084, mailed Jul. 23, 2014, 7 pages.

Notice of Allowance for U.S. Appl. No. 13/690,187, mailed Sep. 3, 2014, 9 pages.

International Search Report and Written Opinion for PCT/US2012/067230, mailed Feb. 21, 2013, 10 pages.

International Preliminary Report on Patentability and Written Opinion for PCT/US2012/067230, mailed Jun. 12, 2014, 7 pages.

Non-Final Office Action for U.S. Appl. No. 13/684,826, mailed Apr. 3, 2014, 5 pages.

Notice of Allowance for U.S. Appl. No. 13/684,826, mailed Jul. 18, 2014, 7 pages.

Non-Final Office Action for U.S. Appl. No. 14/022,940, mailed Dec. 20, 2013, 5 pages.

Notice of Allowance for U.S. Appl. No. 14/022,940, mailed Jun. 10, 2014, 7 pages.

Non-Final Office Action for U.S. Appl. No. 13/714,600, mailed May 9, 2014, 14 pages.

Non-Final Office Action for U.S. Appl. No. 13/782,142, mailed Sep. 4, 2014, 6 pages.

Non-Final Office Action for U.S. Appl. No. 13/951,976, mailed Apr. 4, 2014, 7 pages.

International Search Report and Written Opinion for PCT/US2013/052277, mailed Jan. 7, 2014, 14 pages.

International Search Report and Written Opinion for PCT/US2013/065403, mailed Feb. 5, 2014, 11 pages.

International Search Report and Written Opinion for PCT/US2014/028089, mailed Jul. 17, 2014, 10 pages.

Invitation to Pay Additional Fees and Partial International Search Report for PCT/US2014/028178, mailed Jul. 24, 2014, 7 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.

Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.

Lie, Donald Y.C. et al., "Highly Efficient and Linear SiGe Power Amplifier Design," 8th International Conference on Solid-State and Integrated Circuit Technology (ICSICT), Oct. 23-26, 2006, pp. 1526-1529.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20-Envelope%20Tracking%20Patent&type=n.

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

(56) References Cited

OTHER PUBLICATIONS

Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Notice of Allowance for U.S. Appl. No. 14/072,140, mailed Dec. 2, 2014, 8 pages.

First Office Action for Chinese Patent Application No. 201280026559.0 issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.

(56) References Cited

OTHER PUBLICATIONS

International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
European Search Report for European Patent Application No. 14190851.7, issued Mar. 5, 2015, 6 pages.
First Office Action for Chinese Patent Application No. 201180030273.5, issued Dec. 3, 2014, 15 pages. (with English translation).
International Preliminary Report on Patentability for PCT/US2013/052277, mailed Feb. 5, 2015, 9 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
European Examination Report for European Patent Application No. 14162682.0, mailed May 22, 2015, 5 pages.
International Preliminary Report on Patentability for PCT/US2013/065403, mailed Apr. 30, 2015, 8 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
Notice of Allowance for U.S. Appl. No. 13/948,291, mailed Jul. 17, 2015, 8 pages.

(56) References Cited

OTHER PUBLICATIONS

Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.

\* cited by examiner

US 9,178,627 B2

RUGGED IQ RECEIVER BASED RF GAIN MEASUREMENTS

PRIORITY CLAIMS

The present application is a national stage application under 35 U.S.C. §371 of international patent application number PCT/US12/40317 filed May 31, 2012. International application PCT/US12/40317 claims priority to U.S. provisional patent application No. 61/491,416, filed May 31, 2011. All of the above listed applications are hereby incorporated herein by reference in their entireties.

FIELD OF THE DISCLOSURE

Embodiments of the present disclosure relate to radio frequency (RF) transmitter circuitry, which may be used in RF communications systems, and calibration of the RF transmitter circuitry.

BACKGROUND OF THE DISCLOSURE

As wireless communications technologies evolve, wireless communications systems become increasingly sophisticated. As such, wireless communications protocols continue to expand and change to take advantage of the technological evolution, which may provide support for increasing numbers of simultaneous users in a given RF communications space. In this regard, close management and control of RF transmitters utilized by the simultaneous users may be required, thereby requiring ongoing adjustments of the RF transmitters. RF gains of the RF transmitters may vary with different operational parameters, such as output power, power amplifier supply voltage, type of RF modulation, and the like. As such, certain RF transmitter adjustments may be required based on RF gain. Such adjustments may include changes in transmitter pre-distortion, changes in envelope tracking system operation, changes in transmitter bias, and the like. Therefore, pre-determining a complex RF gain of a transmit path of a wireless device may be useful in making adjustments to the RF transmitter of the wireless device. Thus, there is a need for a pre-determined complex RF gain in the transmit path of the wireless device.

SUMMARY OF THE EMBODIMENTS

Embodiments of the present disclosure relate to a method and an apparatus for measuring a complex gain of a transmit path. Circuitry includes an IQ to RF modulator, an RF to IQ down-converter, and a digital frequency converter. During a test mode, the IQ to RF modulator modulates a quadrature RF carrier signal using a quadrature test signal. During the test mode, the RF to IQ down-converter down-converts a down-converter RF input signal to provide a quadrature down-converter output signal using the quadrature RF carrier signal. The down-converter RF input signal is based on the quadrature test signal and the complex gain of the transmit path. During the test mode, the digital frequency converter frequency converts the quadrature down-converter output signal to provide an averaged frequency converter output signal, which is a quadrature DC signal that is representative of an amplitude and phase of the quadrature test signal and the complex gain of the transmit path. The quadrature down-converter output signal is synchronized to the quadrature test signal. A measured complex gain of the transmit path is based on the amplitude and phase of the quadrature test signal and the averaged frequency converter output signal.

The RF to IQ down-converter is part of an IQ receiver, which may be relatively inexpensive. Such IQ receivers may have certain shortcomings, such as RF carrier leakage, interference from RF images, and the like, that adversely affect complex gain measurements. However, by incorporating the digital frequency converter into the IQ receiver and using a special test signal, as described, the effects of such shortcomings are significantly reduced, thereby ruggedizing the IQ receiver when making complex gain measurements.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 9:
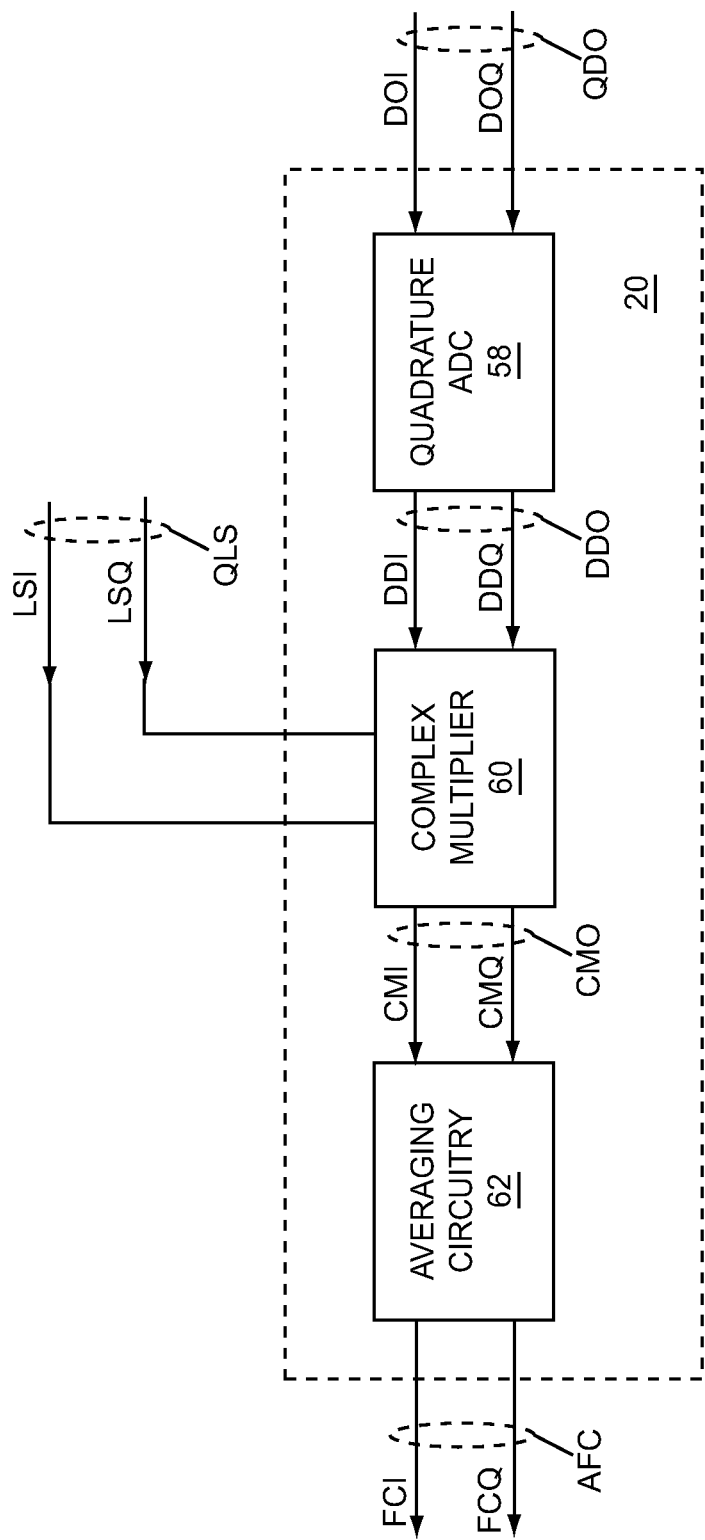
FIG. 9 shows details of a digital frequency converter illustrated in FIG. 6 according to one embodiment of the digital frequency converter.
Figure 10:
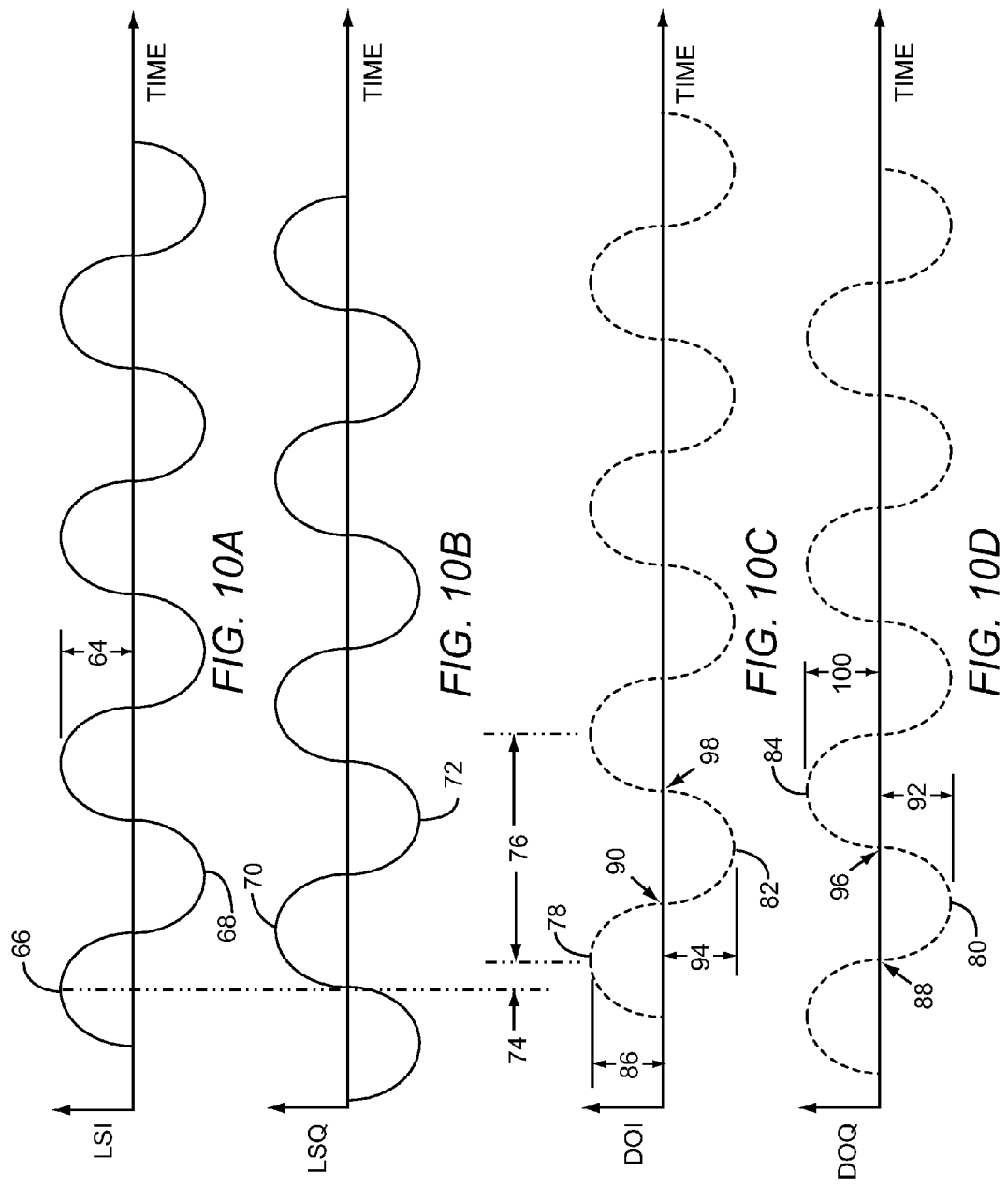
Figure 11:
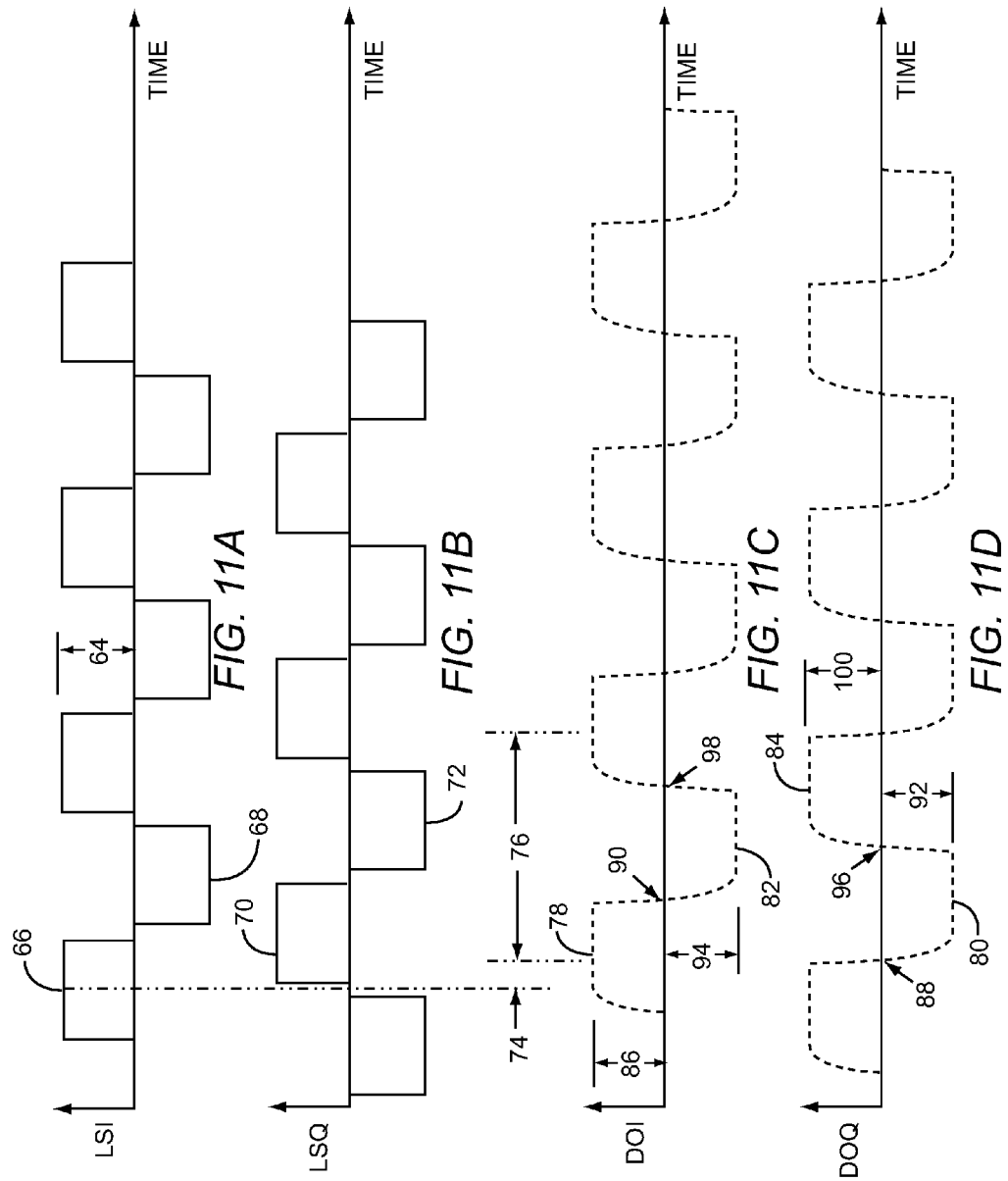

FIGS. 10A, 10B, 10C, and 10D are graphs illustrating an in-phase local oscillator signal, a quadrature-phase local oscillator signal, an in-phase down-converter output signal, and a quadrature-phase down-converter output signal, respectively, shown in FIG. 9 according to one embodiment of the RF communications system.

FIGS. 11A, 11B, 11C, and 11D are graphs illustrating the in-phase local oscillator signal, the quadrature-phase local oscillator signal, the in-phase down-converter output signal, and the quadrature-phase down-converter output signal, respectively, shown in FIG. 9 according to an alternate embodiment of the RF communications system.

Figure 12:
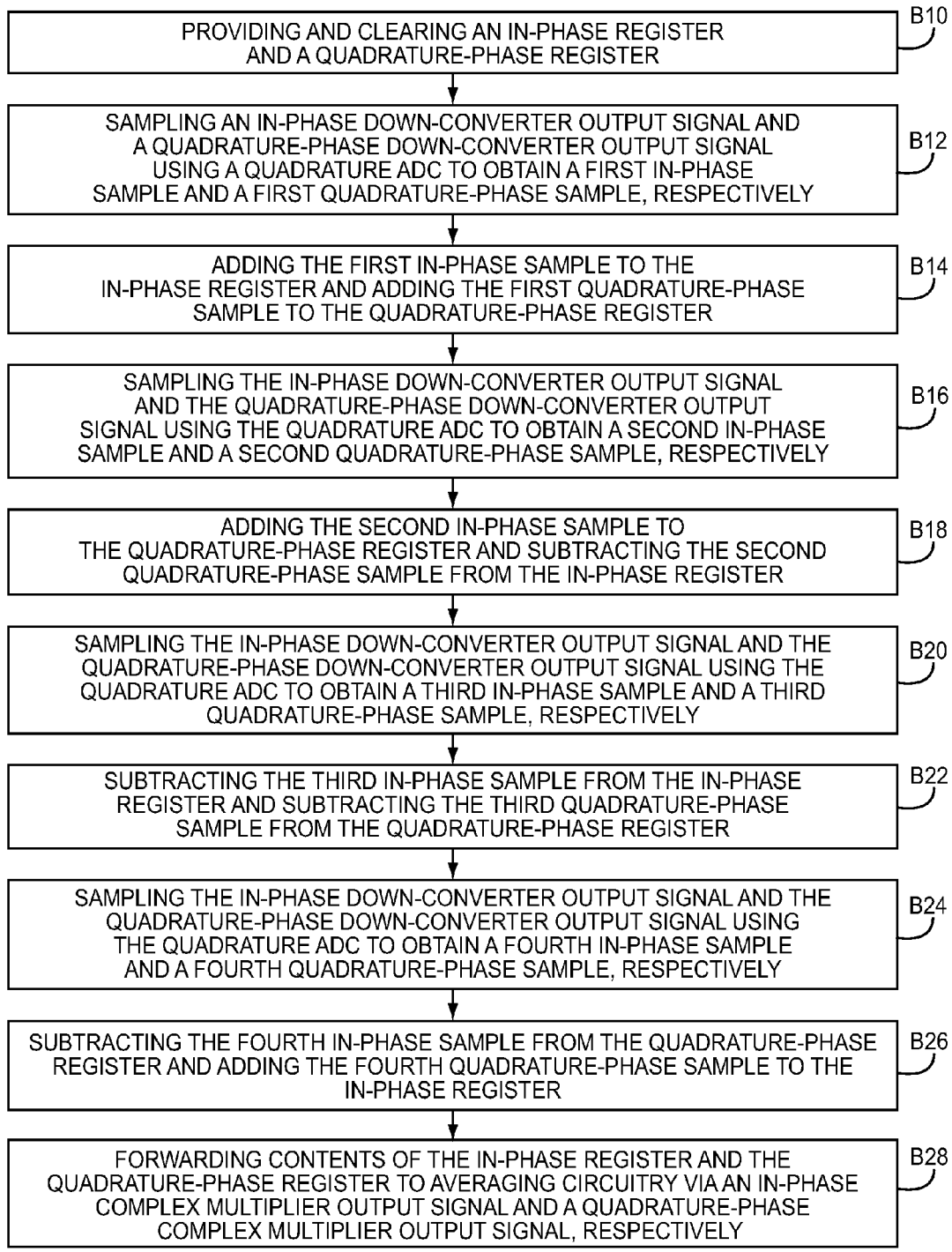

FIG. 12 illustrates a process for processing an in-phase down-converter output signal and a quadrature-phase down-converter output signal illustrated in FIG. 9 according to one embodiment of the digital frequency converter.

Figure 13:
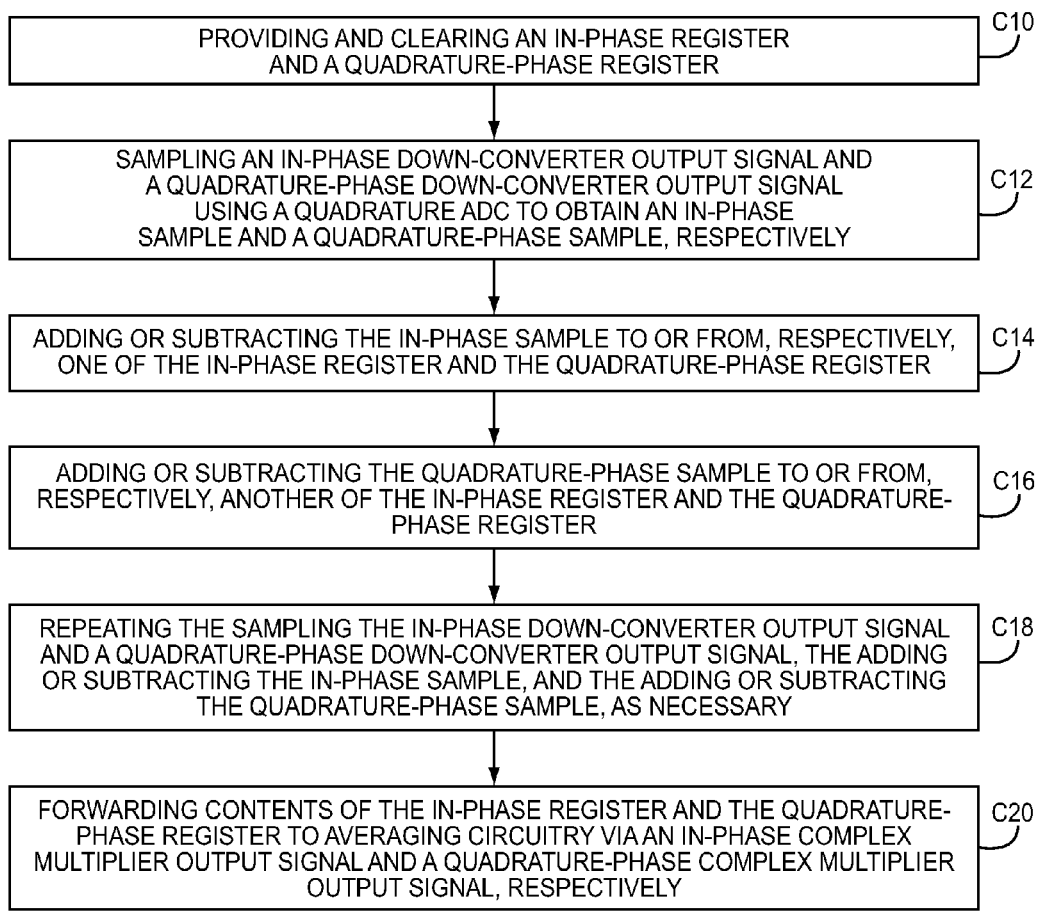

FIG. 13 illustrates a process for processing the in-phase down-converter output signal and the quadrature-phase down-converter output signal illustrated in FIG. 9 according to an alternate embodiment of the digital frequency converter.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to a method and an apparatus for measuring a complex gain of a transmit path. Circuitry includes an IQ to RF modulator, an RF to IQ down-converter, and a digital frequency converter. During a test mode, the IQ to RF modulator modulates a quadrature RF carrier signal using a quadrature test signal. During the test mode, the RF to IQ down-converter down-converts a down-converter RF input signal to provide a quadrature down-converter output signal using the quadrature RF carrier signal. The down-converter RF input signal is based on the quadrature test signal and the complex gain of the transmit path. During the test mode, the digital frequency converter frequency converts the quadrature down-converter output signal to provide an averaged frequency converter output signal, which is a quadrature DC signal that is representative of an amplitude and phase of the quadrature test signal and the complex gain of the transmit path. The quadrature down-converter output signal is synchronized to the quadrature test signal. A measured complex gain of the transmit path is based on the amplitude and phase of the quadrature test signal and the averaged frequency converter output signal.

The RF to IQ down-converter is part of an IQ receiver, which may be relatively inexpensive. Such IQ receivers may have certain shortcomings, such as RF carrier leakage, interference from RF images, and the like, that adversely affect complex gain measurements. However, by incorporating the digital frequency converter into the IQ receiver and using a special test signal, as described, the effects of such shortcomings are significantly reduced, thereby ruggedizing the IQ receiver when making complex gain measurements.

Figure 1:
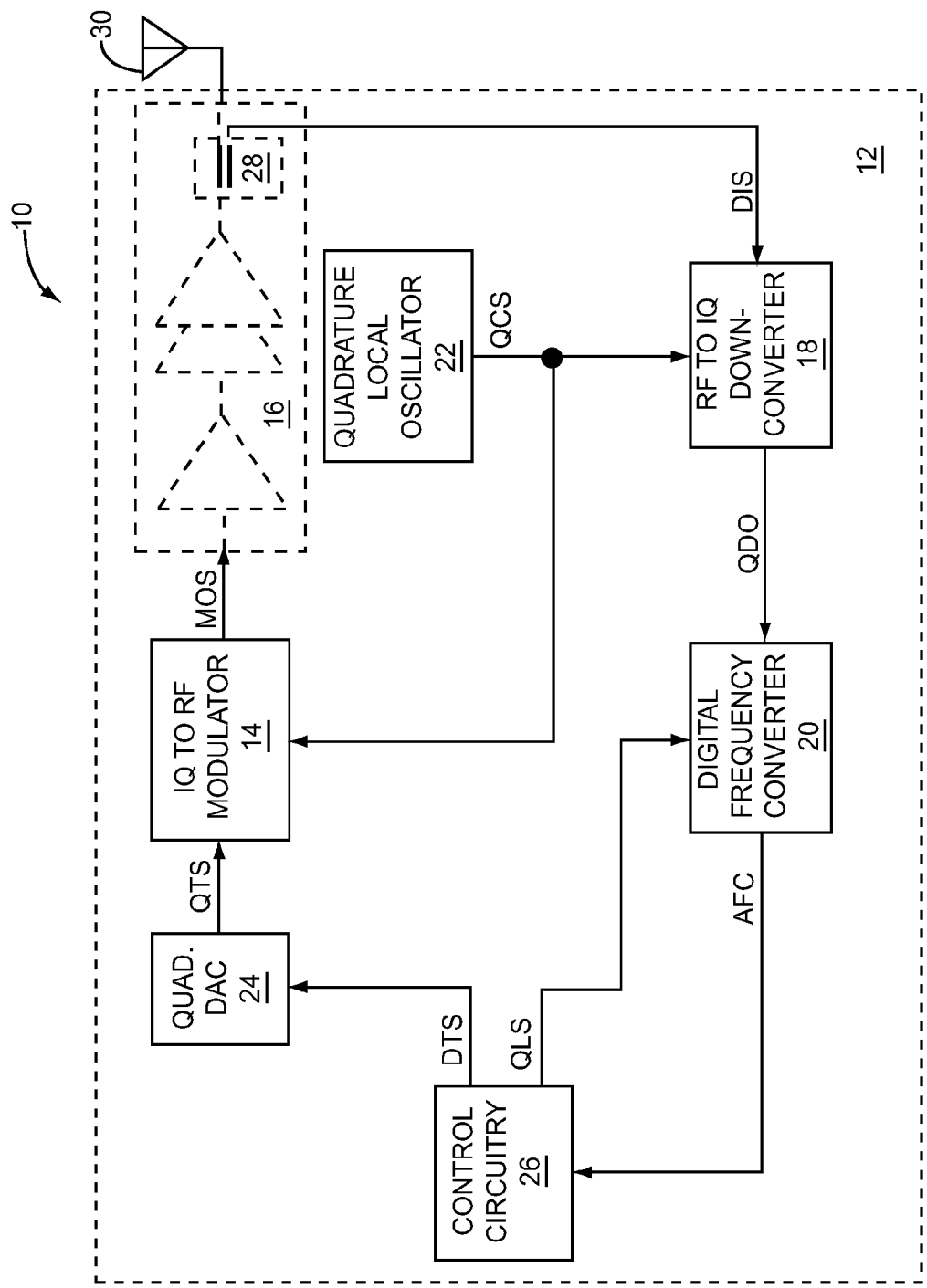
FIG. 1 shows an RF communications system during a test according to one embodiment of the RF communications system.

FIG. 1 shows an RF communications system 10 during a test mode according to one embodiment of the RF communications system 10. The RF communications system 10 includes antenna facing circuitry 12, which includes an IQ to RF modulator 14, a transmit path 16, an RF to IQ down-converter 18, a digital frequency converter 20, a quadrature local oscillator 22, a quadrature digital to analog converter (DAC) 24, and control circuitry 26. The transmit path 16 includes an RF coupler 28. The RF communications system 10 further includes an RF antenna 30. In one embodiment of the transmit path 16, the transmit path 16 is an uplink path. The transmit path 16 is coupled between the IQ to RF modulator 14 and the RF antenna 30. The transmit path 16 may further include portions of or all of one or more RF amplifier stages, RF switching circuitry, RF filter circuitry, one or more RF diplexers, one or more RF duplexers, other RF filtering, impedance matching circuitry, other RF front-end circuitry, the like, or any combination thereof coupled in series with the RF coupler 28. During the test mode, the RF communications system 10 functions to measure a complex gain of the transmit path 16.

The control circuitry 26 selects one of the test mode and a normal operating mode. As such, the antenna facing circuitry 12 operates in the selected one of the test mode and the normal operating mode. In one embodiment of the RF communications system 10, during the test mode, the control circuitry 26 provides a digital quadrature test signal DTS to the quadrature DAC 24, which converts the digital quadrature test signal DTS from a digital signal into an analog signal. Further, the control circuitry 26 provides a quadrature local oscillator signal QLS to the digital frequency converter 20. The quadrature local oscillator signal QLS is a digital signal. Specifically, during the test mode, the quadrature DAC 24 receives and digital-to-analog converts the digital quadrature test signal DTS to provide a quadrature test signal QTS, which is an analog signal, to the IQ to RF modulator 14.

During the test mode, the quadrature local oscillator 22 provides a quadrature RF carrier signal QCS to the IQ to RF modulator 14 and to the RF to IQ down-converter 18. During the test mode, the IQ to RF modulator 14 modulates the quadrature RF carrier signal QCS using the quadrature test signal QTS to provide a RF modulator output signal MOS to the transmit path 16. During the test mode, the RF coupler 28 couples a portion of an RF signal flowing through the RF coupler 28 to provide a down-converter RF input signal DIS to the RF to IQ down-converter 18. The RF signal flowing through the RF coupler 28 is based on the RF modulator output signal MOS. As such, the RF signal flowing through the RF coupler 28 is representative of the quadrature test signal QTS and the complex gain of the transmit path 16. In this regard, the portion of an RF signal flowing through the RF coupler 28 and the down-converter RF input signal DIS are also representative of the quadrature test signal QTS and the complex gain of the transmit path 16. Further, the down-converter RF input signal DIS is based on the quadrature test signal QTS and the complex gain of the transmit path 16.

During the test mode, the RF to IQ down-converter 18 down-converts the down-converter RF input signal DIS to provide a quadrature down-converter output signal QDO using the quadrature RF carrier signal QCS. In this regard, the quadrature down-converter output signal QDO is representative of an amplitude and phase of the quadrature test signal QTS and the complex gain of the transmit path 16. During the test mode, the digital frequency converter 20 frequency converts the quadrature down-converter output signal QDO to provide an averaged frequency converter output signal AFC to the control circuitry 26 using the quadrature local oscillator signal QLS. The quadrature down-converter output signal ODD is synchronized to the quadrature test signal QTS. As such, the averaged frequency converter output signal AFC is a quadrature DC signal that is representative of an amplitude and phase of the quadrature test signal QTS and the complex gain of the transmit path 16. Specifically, a measured complex gain of the transmit path 16 is based on an amplitude and phase of the quadrature test signal QTS, which correlates to an amplitude and phase of the digital quadrature test signal DTS, and a magnitude and phase of the averaged frequency converter output signal AFC. Therefore, the control circuitry 26 may determine the measured complex gain of the transmit path 16 based on the quadrature local oscillator signal QLS and the averaged frequency converter output signal AFC.

Figure 2:
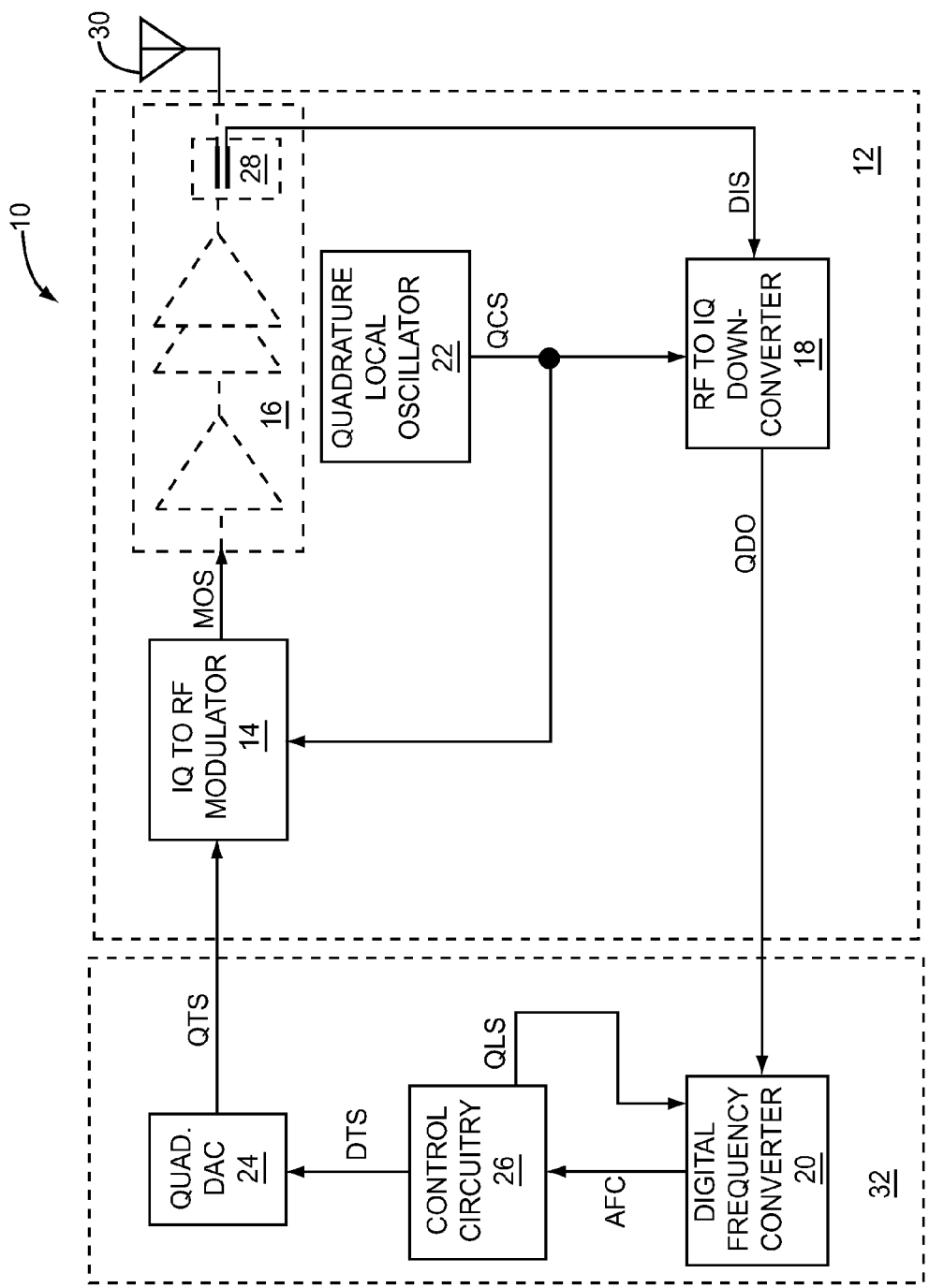
FIG. 2 shows the RF communications system during the test mode according to an alternate embodiment of the RF communications system.

FIG. 2 shows the RF communications system 10 during the test mode according to an alternate embodiment of the RF communications system 10. The RF communications system 10 illustrated in FIG. 2 is similar to the RF communications system 10 illustrated in FIG. 1, except the RF communications system 10 illustrated in FIG. 2 further includes baseband facing circuitry 32. The antenna facing circuitry 12 includes the IQ to RF modulator 14, the transmit path 16, the RF to IQ down-converter 18, and the quadrature local oscillator 22, whereas the baseband facing circuitry 32 includes the digital frequency converter 20, the quadrature DAC 24, and the control circuitry 26.

Other embodiments of the RF communications system 10 may have different allocations of the IQ to RF modulator 14, the transmit path 16, the RF to IQ down-converter 18, the digital frequency converter 20, the quadrature local oscillator 22, the quadrature DAC 24, and the control circuitry 26 between the antenna facing circuitry 12 and the baseband facing circuitry 32. In one embodiment of the antenna facing circuitry 12, an RF front-end module provides the antenna facing circuitry 12. The RF front-end module includes at least one integrated circuit (IC). In one embodiment of the baseband facing circuitry 32, a baseband controller provides the baseband facing circuitry 32. The baseband controller includes at least one IC. In an alternate embodiment of the baseband facing circuitry 32, transceiver circuitry provides the baseband facing circuitry 32. The transceiver circuitry includes at least one IC.

Figure 3:
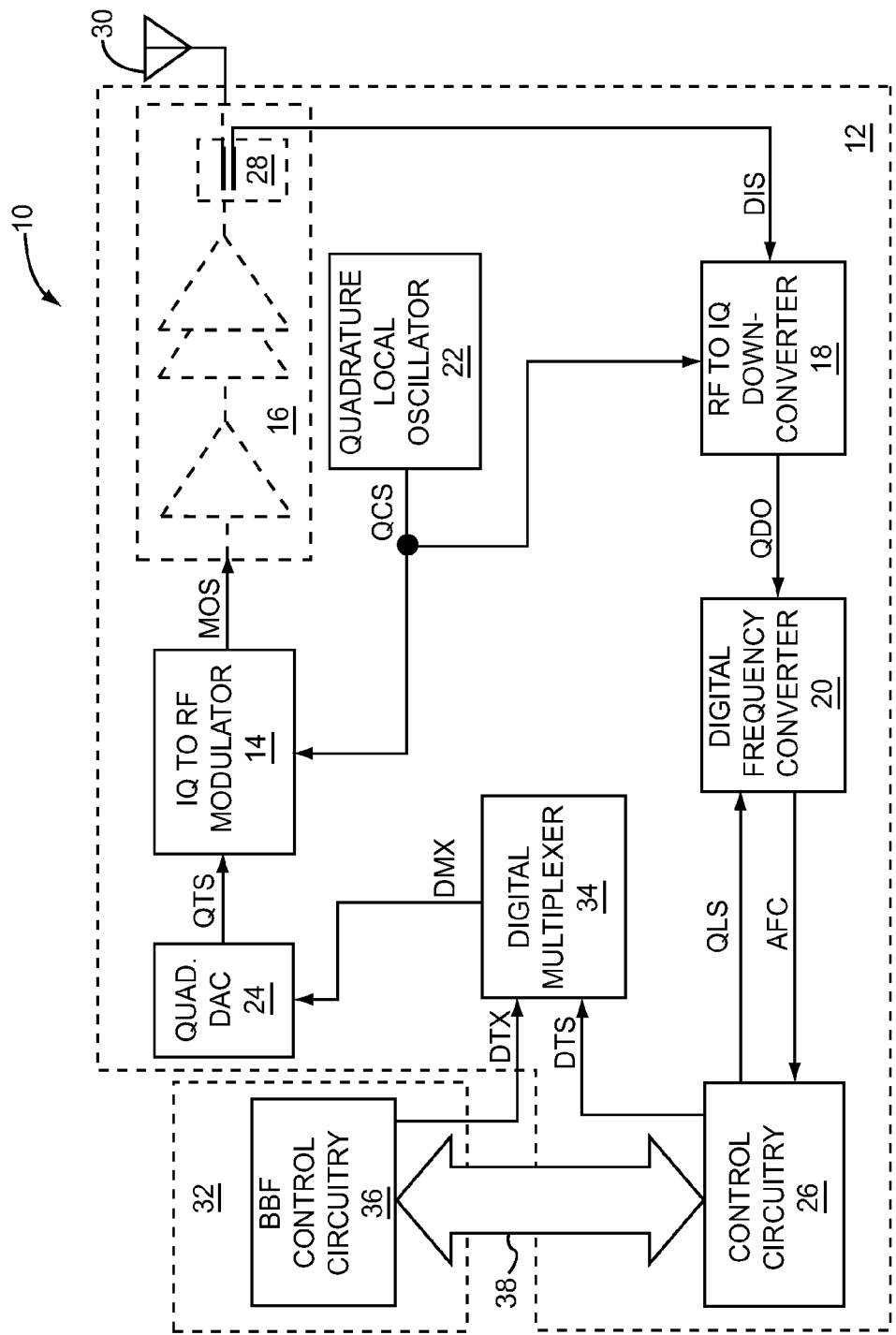
FIG. 3 shows the RF communications system during the test mode according to an additional embodiment of the RF communications system.

FIG. 3 shows the RF communications system 10 during the test mode according to an additional embodiment of the RF communications system 10. The RF communications system 10 illustrated in FIG. 3 is similar to the RF communications system 10 illustrated in FIG. 1, except the RF communications system 10 illustrated in FIG. 3 further includes the baseband facing circuitry 32 and the antenna facing circuitry 12 further includes a digital multiplexer 34. The baseband facing circuitry 32 includes baseband facing control circuitry 36, which is coupled to the control circuitry 26 via a digital communications bus 38. As such, the control circuitry 26 and the baseband facing control circuitry 36 can communicate with one another via the digital communications bus 38.

Both the antenna facing circuitry 12 and the baseband facing circuitry 32 operate in the selected one of the test mode and the normal operating mode. In one embodiment of the RF communications system 10, the baseband facing control circuitry 36 selects the one of the test mode and the normal operating mode and indicates the mode selection using the digital communications bus 38. During the test mode, the control circuitry 26 provides the digital quadrature test signal DTS to the digital multiplexer 34. During the normal operating mode, the baseband facing control circuitry 36 provides a digital quadrature transmit signal DTX to the digital multiplexer 34.

The digital multiplexer 34 provides a digital multiplexer output signal DMX to the quadrature DAC 24 based on forwarding either the digital quadrature test signal DTS or the digital quadrature transmit signal DTX. Specifically, during the test mode, the digital multiplexer 34 forwards the digital quadrature test signal DTS to provide the digital multiplexer output signal DMX. During the normal operating mode, the digital multiplexer 34 forwards the digital quadrature transmit signal DTX to provide the digital multiplexer output signal DMX. In an alternate embodiment of the RF communications system 10, during the normal operating mode, the baseband facing control circuitry 36 provides the digital quadrature transmit signal DTX to the digital multiplexer 34 via the digital communications bus 38 and the control circuitry 26. During the test mode, since the digital multiplexer output signal DMX is based on the digital quadrature test signal DTS, the quadrature DAC 24 receives and digital-to-analog converts the digital multiplexer output signal DMX to provide the quadrature test signal QTS.

Figure 4:
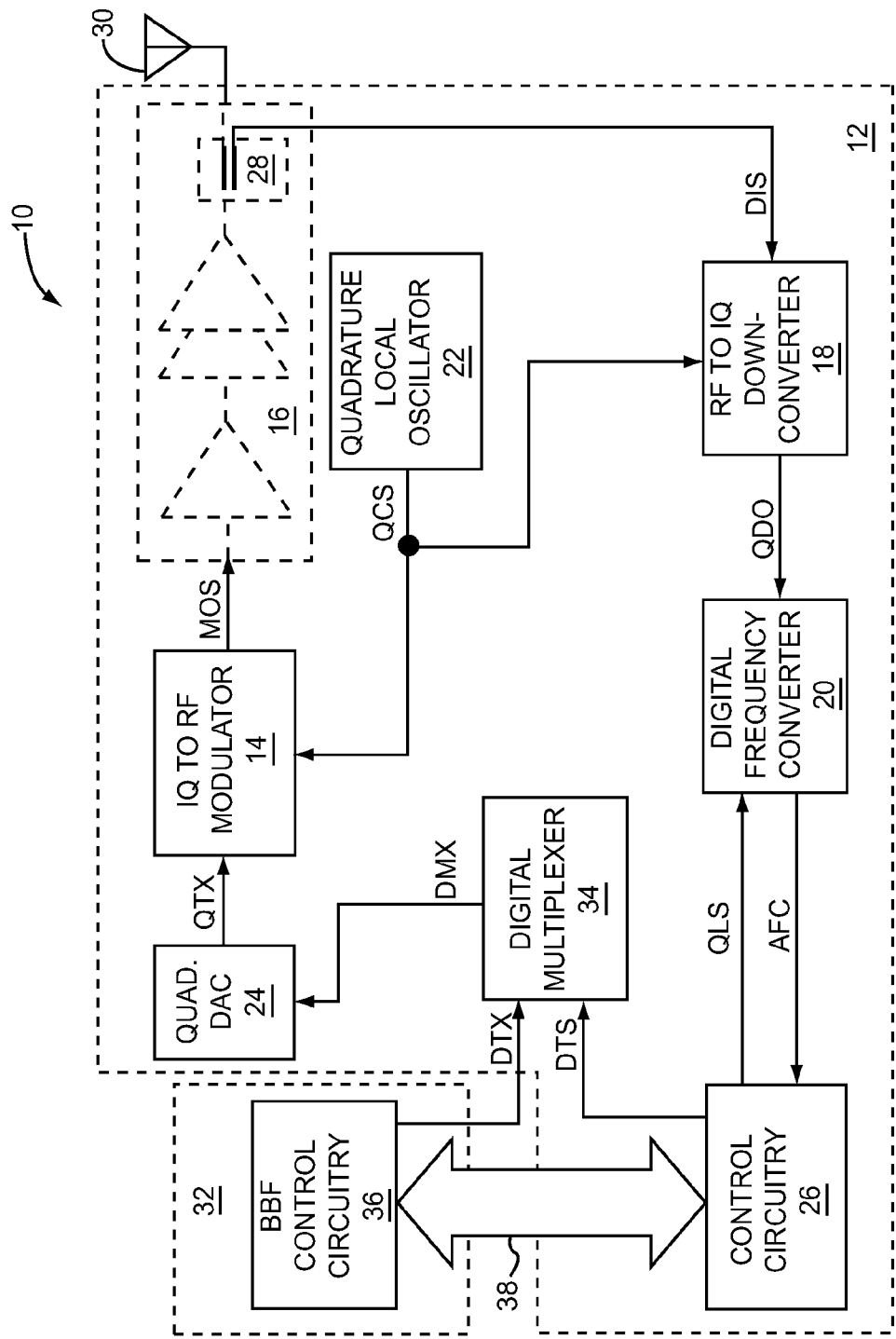
FIG. 4 shows the RF communications system during the normal operating mode according to another embodiment of the RF communications system.

FIG. 4 shows the RF communications system 10 during the normal operating mode according to another embodiment of the RF communications system 10. The RF communications system 10 illustrated in FIG. 4 is similar to the RF communications system 10, except during the normal operating mode, the baseband facing control circuitry 36 provides the digital quadrature transmit signal DTX to the digital multiplexer 34. During the normal operating mode, the digital multiplexer 34 forwards the digital quadrature transmit signal DTX to provide the digital multiplexer output signal DMX. The quadrature DAC 24 receives and digital-to-analog converts the digital multiplexer output signal DMX to provide a quadrature transmit signal QTX instead of the quadrature test signal QTS.

Processing of the quadrature transmit signal QTX by the IQ to RF modulator 14 and the transmit path 16 during the normal operating mode may be similar to processing of the quadrature test signal QTS during the test mode. However, processing of the quadrature transmit signal QTX may include processing and forwarding the quadrature transmit signal QTX to the RF antenna 30. In one embodiment of the antenna facing circuitry 12, during the normal operating mode, feedback is used to feed a processed portion of the digital quadrature transmit signal QTX to the control circuitry 26 via the RF to IQ down-converter 18 and the digital frequency converter 20. In an alternate embodiment of the antenna facing circuitry 12, during the normal operating mode, feedback is not used. As such, during the normal operating mode, the RF to IQ down-converter 18 and the digital frequency converter 20 are not used.

During the normal operating mode, the IQ to RF modulator 14 RF modulates the quadrature RF carrier signal QCS using the quadrature transmit signal QTX to provide the RF modulator output signal MOS to the transmit path 16. Further, in one embodiment of the antenna facing circuitry 12, during the normal operating mode, the RF modulator output signal MOS is processed and forwarded to the RF antenna 30 via the transmit path 16.

Figure 5:
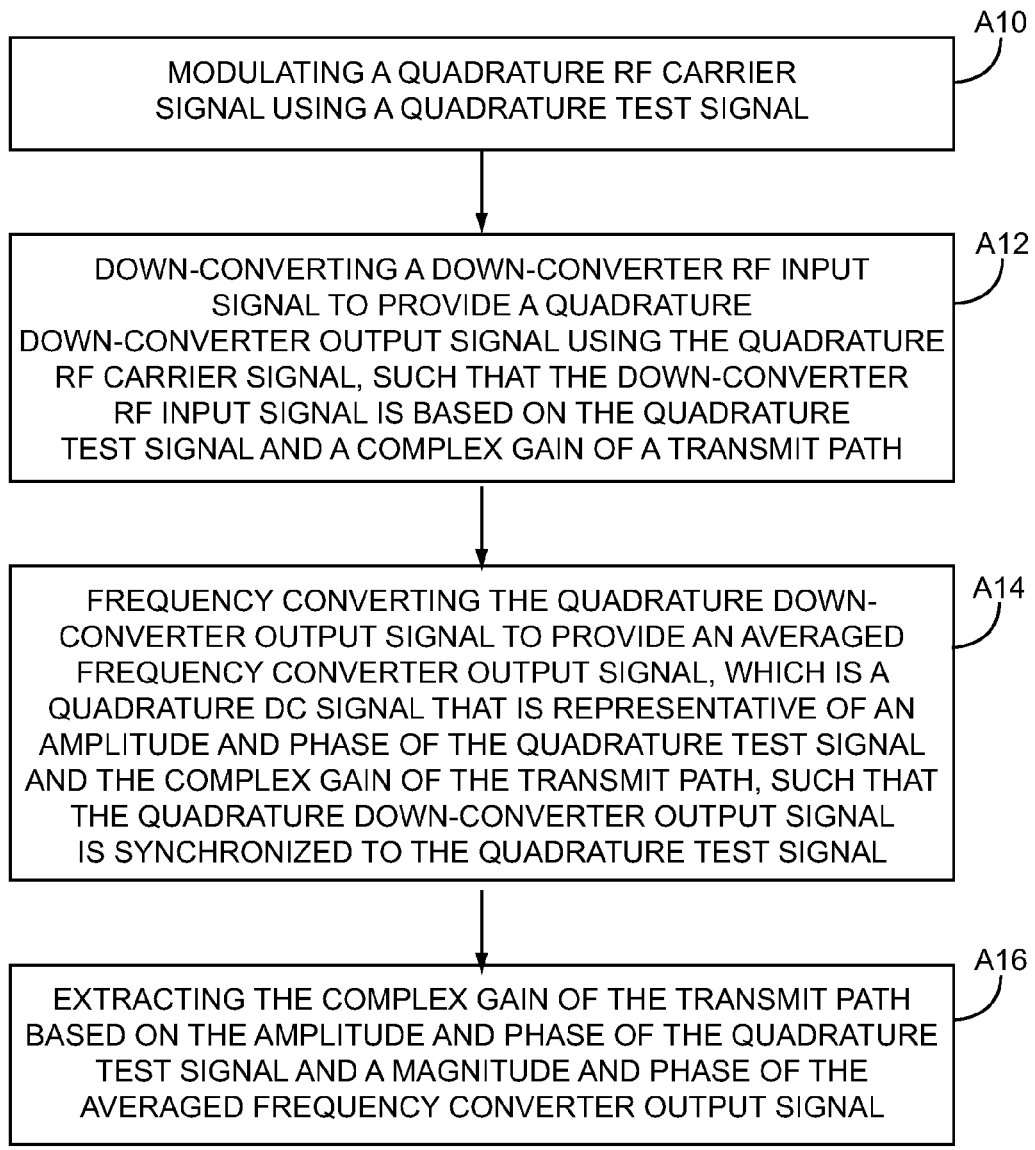
FIG. 5 illustrates a process for measuring a complex gain of a transmit path illustrated in FIG. 1 according to one embodiment of the RF communications system.

FIG. 5 illustrates a process for measuring the complex gain of the transmit path 16 illustrated in FIG. 1 according to one embodiment of the RF communications system 10. In this regard, all signals and apparatus elements in the process are illustrated in FIG. 1. The process begins by modulating the quadrature RF carrier signal QCS using the quadrature test signal QTS (Step A10). The process continues by down-converting the down-converter RF input signal DIS to provide the quadrature down-converter output signal ODD, such that the down-converter RF input signal DIS is based on the quadrature test signal OTS and the complex gain of the transmit path 16 (Step A12).

The process progresses by frequency converting the quadrature down-converter output signal ODD to provide the averaged frequency converter output signal AFC, which is a quadrature DC signal that is representative of the amplitude and phase of the quadrature test signal QTS and the complex gain of the transmit path 16, such that the quadrature down-converter output signal ODD is synchronized to the quadrature test signal QTS (Step A14). The process concludes by extracting the complex gain of the transmit path 16 based on the amplitude and phase of the quadrature test signal QTS and the magnitude and phase of the averaged frequency converter output signal AFC (Step A16).

Figure 6:
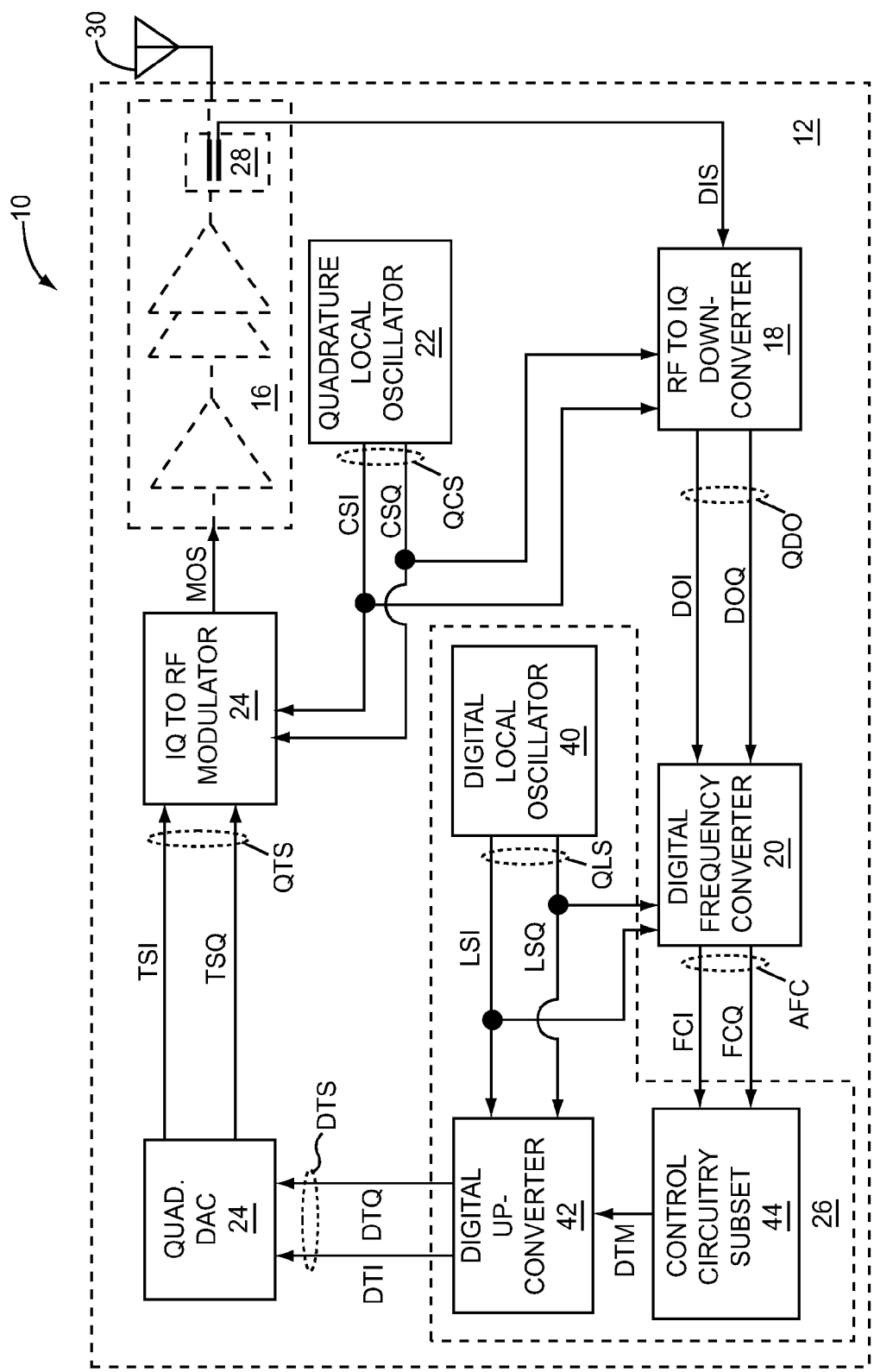
FIG. 6 shows the RF communications system during the test mode according to a further embodiment of the RF communications system.

FIG. 6 shows the RF communications system 10 during the test mode according to a further embodiment of the RF communications system 10. The RF communications system 10 illustrated in FIG. 6 is similar to the RF communications system 10 illustrated in FIG. 1, except the RF communications system 10 illustrated in FIG. 6 shows details of the control circuitry 26 and details of the digital quadrature test signal DTS, the quadrature test signal QTS, the quadrature RF carrier signal QCS, the quadrature down-converter output signal (MO, and the averaged frequency converter output signal AFC. The digital quadrature test signal DTS has a digital in-phase test signal DTI and a digital quadrature-phase test signal DTQ. The quadrature test signal QTS has an in-phase test signal TSI and a quadrature-phase test signal TSQ.

A continuous wave (CW) signal is defined as an un-modulated signal of constant amplitude and frequency. In a first embodiment of the RF communications system 10, during the test mode, the digital in-phase test signal DTI is a CW signal and the digital quadrature-phase test signal DTQ is a CW signal, such that an amplitude of the digital quadrature-phase test signal DTQ is about equal to an amplitude of the digital in-phase test signal DTI. Further, the digital quadrature-phase test signal DTQ is phase-shifted from the digital in-phase test signal DTI by about 90 degrees. Therefore, both the in-phase test signal TSI and the quadrature-phase test signal TSQ are CW signals, such that an amplitude of the quadrature-phase test signal TSQ is about equal to an amplitude of the in-phase test signal TSI. Further, the quadrature-phase test signal TSQ is phase-shifted from the in-phase test signal TSI by about 90 degrees.

The quadrature RF carrier signal QCS has an in-phase carrier signal CSI and a quadrature-phase carrier signal CSQ. In the first embodiment of the RF communications system 10, during the test mode, the in-phase carrier signal CSI and the quadrature-phase carrier signal CSQ are both CW signals, such that an amplitude of the quadrature-phase carrier signal CSQ is about equal to an amplitude of the in-phase carrier signal CSI. Further, the quadrature-phase carrier signal CSQ is phase-shifted from the in-phase carrier signal CSI by about 90 degrees.

The control circuitry 26 includes a digital local oscillator 40, a digital up-converter 42, and a control circuitry subset 44. During the test mode, the digital local oscillator 40 provides a quadrature local oscillator signal QLS to the digital frequency converter 20 and to the digital up-converter 42. The quadrature local oscillator signal QLS has an in-phase local oscillator signal LSI and a quadrature-phase local oscillator signal LSQ. In the first embodiment of the RF communications system 10, during the test mode, the in-phase local oscillator signal LSI and the quadrature-phase local oscillator signal LSQ are both CW signals, such that an amplitude of the quadrature-phase local oscillator signal LSQ is about equal to an amplitude of the in-phase local oscillator signal LSI. Further, the quadrature-phase local oscillator signal LSQ is phase-shifted from the in-phase local oscillator signal LSI by about 90 degrees.

During the test mode, the control circuitry subset 44 provides a digital test magnitude signal DTM to the digital up-converter 42. The digital up-converter 42 up-converts the digital test magnitude signal DTM using the quadrature local oscillator signal QLS to provide the digital quadrature test signal DTS. In one embodiment of the digital up-converter 42, the digital up-converter 42 provides the digital in-phase test signal DTI based on the in-phase local oscillator signal LSI and provides the digital quadrature-phase test signal DTQ based on the quadrature-phase local oscillator signal LSQ, such that magnitudes of the digital in-phase test signal DTI and the digital quadrature-phase test signal DTQ are based on the digital test magnitude signal DTM. Further, a frequency of the digital in-phase test signal DTI is about equal to a frequency of the in-phase local oscillator signal LSI, and a frequency of the digital quadrature-phase test signal DTQ is about equal to a frequency of the quadrature-phase local oscillator signal LSQ.

In a first embodiment of the digital up-converter 42, the digital in-phase test signal DTI is phase-shifted from the in-phase local oscillator signal LSI by about 180 degrees, and the digital quadrature-phase test signal DTQ is phase-shifted from the quadrature-phase local oscillator signal LSQ by about 180 degrees. In a second embodiment of the digital up-converter 42, the digital in-phase test signal DTI is about phase-aligned with the in-phase local oscillator signal LSI, and the digital quadrature-phase test signal DTQ is about phase-aligned with the quadrature-phase local oscillator signal LSQ.

The quadrature down-converter output signal QDO has an in-phase down-converter output signal DOI and a quadrature-phase down-converter output signal DOQ. The averaged frequency converter output signal AFC has an in-phase frequency converter output signal FCI and a quadrature-phase frequency converter output signal FCQ. Further, the digital frequency converter 20 provides the averaged frequency converter output signal AFC to the control circuitry subset 44.

Figure 7:
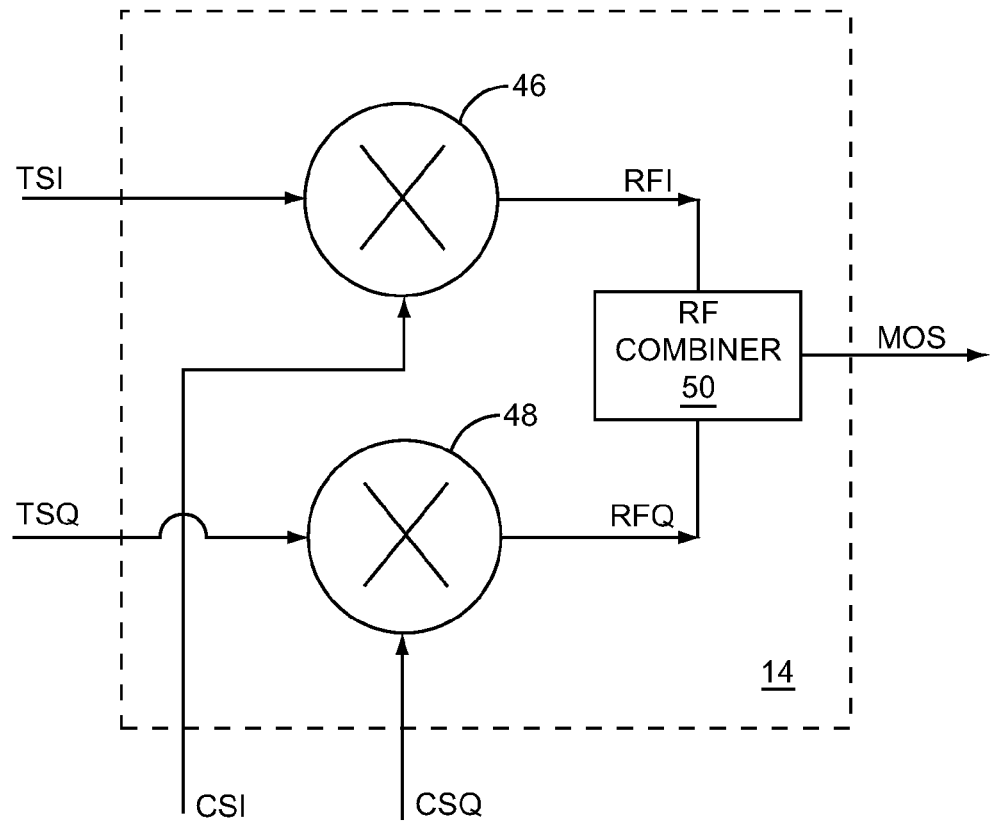
FIG. 7 shows details of an IQ to RF modulator illustrated in FIG. 6 according to one embodiment of the IQ to RF modulator.

FIG. 7 shows details of the IQ to RF modulator 14 illustrated in FIG. 6 according to one embodiment of the IQ to RF modulator 14. The IQ to RF modulator 14 includes a first in-phase RF mixer 46, a first quadrature-phase RF mixer 48, and an RF combiner 50. During the test mode, the first in-phase RF mixer 46 RF modulates the in-phase carrier signal CSI using the in-phase test signal TSI by mixing the in-phase carrier signal CSI and the in-phase test signal TSI to provide an in-phase RF signal RFI. During the test mode, the first quadrature-phase RF mixer 48 RF modulates the quadrature-phase carrier signal CSQ using the quadrature-phase test signal TSQ by mixing the quadrature-phase carrier signal CSQ and the quadrature-phase test signal TSQ to provide a quadrature-phase RF signal RFQ. During the test mode, the RF combiner 50 receives and combines the in-phase RF signal RFI and the quadrature-phase RF signal RFQ to provide the RF modulator output signal MOS.

Figure 8:
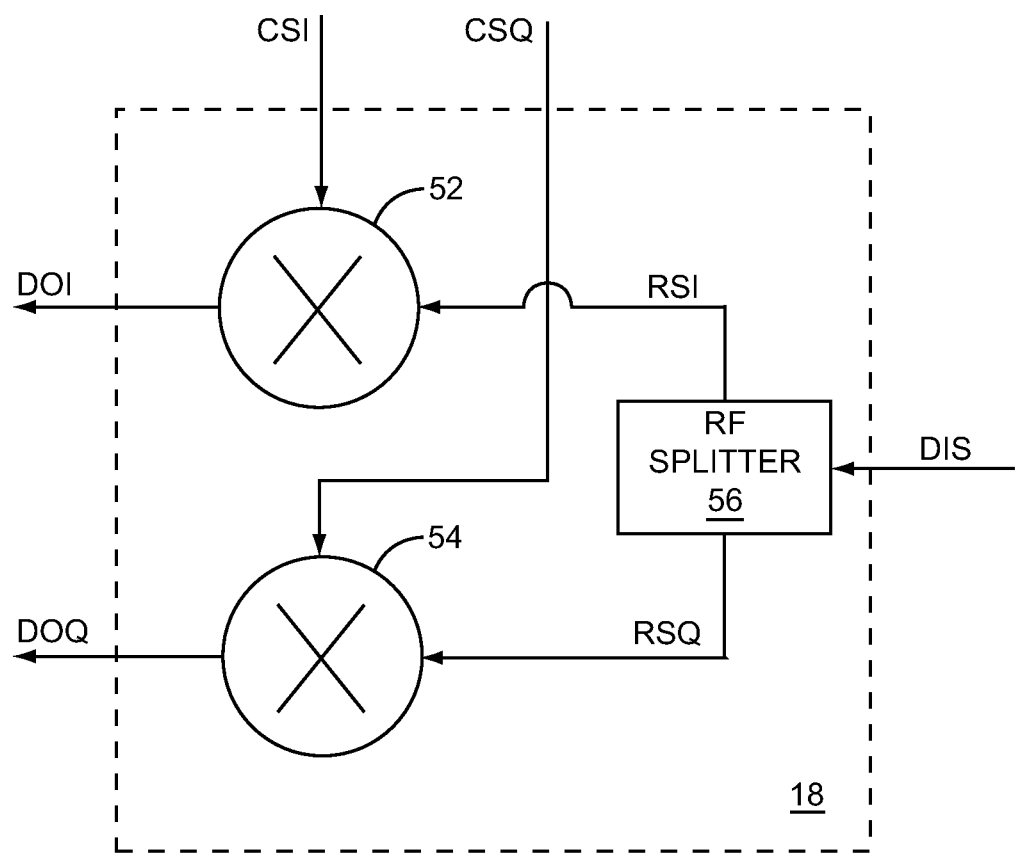
FIG. 8 shows details of an RF to IQ down-converter illustrated in FIG. 6 according to one embodiment of the RF to IQ down-converter.

FIG. 8 shows details of the RF to IQ down-converter 18 illustrated in FIG. 6 according to one embodiment of the RF to IQ down-converter 18. The RF to IQ down-converter 18 includes a second in-phase RF mixer 52, a second quadrature-phase RF mixer 54, and an RF splitter 56. During the test mode, the RF splitter 56 receives and splits the down-converter RF input signal DIS to provide an in-phase side RF signal RSI and a quadrature-phase side RF signal RSQ. During the test mode, the second in-phase RF mixer 52 down-converts the in-phase side RF signal RSI using the in-phase carrier signal CSI by mixing the in-phase side RF signal RSI and the in-phase carrier signal CSI to provide the in-phase down-converter output signal DOI. During the test mode, the second quadrature-phase RF mixer 54 down-converts the quadrature-phase side RF signal RSQ using the quadrature-phase carrier signal CSQ by mixing the quadrature-phase side RF signal RSQ and the quadrature-phase carrier signal CSQ to provide the quadrature-phase down-converter output signal DOQ.

FIG. 9 shows details of the digital frequency converter 20 illustrated in FIG. 6 according to one embodiment of the digital frequency converter 20. The digital frequency converter 20 includes a quadrature analog-to-digital converter (ADC) 58, a complex multiplier 60, and averaging circuitry 62. During the test mode, the quadrature ADC 58 receives and analog-to-digital converts the quadrature down-converter output signal QDO to provide a digital quadrature down-converter signal DDO. The quadrature down-converter output signal QDO has the in-phase down-converter output signal DOI and the quadrature-phase down-converter output signal DOQ. The digital quadrature down-converter signal DDO has a digital in-phase down-converter signal DDI and a digital quadrature-phase down-converter signal DDQ.

In this regard, the quadrature ADC 58 receives and analog-to-digital converts the in-phase down-converter output signal DOI to provide the digital in-phase down-converter signal DDI. Further, the quadrature ADC 58 receives and analog-to-digital converts the quadrature-phase down-converter output signal DOQ to provide the digital quadrature-phase down-converter signal DDQ. To provide accurate analog-to-digital conversions, a one-bit resolution of the quadrature ADC 58 needs to be small compared to an amplitude of the in-phase down-converter output signal DOI and to an amplitude of the quadrature-phase down-converter output signal DOQ.

During the test mode, the complex multiplier 60 receives and multiplies the digital quadrature down-converter signal DDO and the quadrature local oscillator signal QLS to provide a quadrature complex multiplier output signal CMO, which has an in-phase complex multiplier output signal CMI and a quadrature-phase complex multiplier output signal CMQ. The multiplication of the digital quadrature down-converter signal DDO and the quadrature local oscillator signal QLS is a complex multiplication. Since the digital quadrature test signal DTS is based on the quadrature local oscillator signal QLS, the multiplication of the digital quadrature down-converter signal DDO and the quadrature local oscillator signal QLS is synchronized to the digital quadrature test signal DTS. In this regard, during one embodiment of the complex multiplier 60, the complex multiplier 60 functions as a synchronous down-mixer of the quadrature test signal QTS (FIG. 6), which has a frequency offset. Therefore, the complex multiplier 60 synchronizes the quadrature down-converter output signal QDO to the quadrature test signal QTS (FIG. 6).

During the test mode, the averaging circuitry 62 receives and averages the quadrature complex multiplier output signal CMO to provide the averaged frequency converter output signal AFC. Specifically, the averaging circuitry 62 receives and averages the in-phase complex multiplier output signal CMI to provide the in-phase frequency converter output signal FCI, and receives and averages the quadrature-phase complex multiplier output signal CMQ to provide the quadrature-phase frequency converter output signal FCQ. By averaging the quadrature complex multiplier output signal CMO, negative effects of certain shortcomings of the RF to IQ down-converter 18 (FIG. 6) may be reduced. Such shortcomings may include RF carrier leakage between the quadrature local oscillator 22 (FIG. 6) and the RF to IQ down-converter 18 (FIG. 6), interference from RF images as a result of mixing, quadrature, mismatch in the RF to IQ down-converter 18 (FIG. 6), the like, or any combination thereof.

In one embodiment of the averaging circuitry 62, to minimize error, during the test mode, the averaging circuitry 62 averages the quadrature complex multiplier output signal CMO for an integer number of samples in one period of the digital quadrature test signal DTS (FIG. 6) and an integer number of periods of the digital quadrature test signal DTS (FIG. 6). In an alternate embodiment of the averaging circuitry 62, to minimize error, during the test mode, the averaging circuitry 62 averages the quadrature complex multiplier output signal CMO for a long time period relative to one period of the digital quadrature test signal DTS (FIG. 6).

An equation relating a magnitude of the averaged frequency converter output signal AFC to the complex gain of the transmit path 16 (FIG. 6) is presented. AFCM is a complex magnitude of the averaged frequency converter output signal AFC, which is a complex signal. DTSA is an amplitude of the digital quadrature test signal DTS (FIG. 6). GAIN is the measured complex gain of the transmit path 16 (FIG. 6). SF is a complex scaling factor. EQ. 1 is an equation for AFCM as shown below.

$$AFCM = GAIN \times DTSA \times SF. \qquad \text{EQ. 1}$$

The complex scaling factor compensates for gains and losses in the signal path other than the complex gain of the transmit path 16 (FIG. 6). For example, the coupling factor of the RF coupler 28 (FIG. 6) would be included in the complex scaling factor. By re-arranging EQ. 1, EQ. 2 is an equation for measured complex gain of the transmit path 16 (FIG. 6) as shown below.

$$GAIN = AFCM/(DTSA \times SF). \qquad \text{EQ. 2}$$

To preserve information, in one embodiment of the RF communications system 10 (FIG. 6), a sampling rate of the quadrature ADC 58 is about equal to a sampling rate of the quadrature DAC 24 (FIG. 6). However, the complex multiplier 60 must perform a complex multiplication for each quadrature sample provided by the quadrature ADC 58.

Therefore, to reduce the computing load of the complex multiplier 60, in an alternate embodiment of the RF communications system 10 (FIG. 6), the sampling rate of the quadrature ADC 58 is less than the sampling rate of the quadrature DAC 24 (FIG. 6). In this regard, some information in the quadrature down-converter output signal QDO is discarded. However, by sampling the quadrature down-converter output signal QDO at specific times, much of the relevant information in the quadrature down-converter output signal QDO may be extracted.

There is a delay from the quadrature local oscillator signal QLS to correlating information in the quadrature down-converter output signal QDO. This delay is a processing delay and is a result of processing quadrature local oscillator signal QLS based signals through the digital up-converter 42 (FIG. 6), the quadrature DAC 24 (FIG. 6), the IQ to RF modulator 14 (FIG. 6), the transmit path 16, and the RF to IQ down-converter 18 (FIG. 6). Therefore, when the sampling rate of the quadrature ADC 58 is less than the sampling rate of the quadrature DAC 24 (FIG. 6), in one embodiment of the quadrature ADC 58, sampling by the quadrature ADC 58 is delayed to compensate for the processing delay in the RF communications system 10 (FIG. 6). To maximize extraction of useful information from the quadrature down-converter output signal QDO, in one embodiment of the quadrature ADC 58, the quadrature down-converter output signal QDO is sampled at correlating amplitude peaks of the in-phase local oscillator signal LSI and the quadrature-phase local oscillator signal LSQ.

As such, in a first embodiment of the quadrature ADC 58, the quadrature down-converter output signal QDO is sampled four times per period of the quadrature test signal QTS (FIG. 6). In a second embodiment of the quadrature ADC 58, the quadrature down-converter output signal QDO is sampled eight times per period of the quadrature test signal OTS (FIG. 6). In a third embodiment of the quadrature ADC 58, the quadrature down-converter output signal QDO is sampled sixteen times per period of the quadrature test signal QTS (FIG. 6). In a fourth embodiment of the quadrature ADC 58, the quadrature down-converter output signal QDO is sampled thirty-two times per period of the quadrature test signal QTS (FIG. 6).

FIGS. 10A, 10B, 10C, and 10D are graphs illustrating the in-phase local oscillator signal LSI, the quadrature-phase local oscillator signal LSQ, the in-phase down-converter output signal DOI, and the quadrature-phase down-converter output signal DOQ, respectively, shown in FIG. 9 according to one embodiment of the RF communications system 10 (FIG. 6). Both the in-phase local oscillator signal LSI and the quadrature-phase local oscillator signal LSQ have a quadrature leg amplitude 64. The in-phase local oscillator signal LSI has a positive in-phase amplitude peak 66 and a negative in-phase amplitude peak 68. The quadrature-phase local oscillator signal LSQ has a positive quadrature-phase amplitude peak 70 and a negative quadrature-phase amplitude peak 72.

In the embodiment of the RF communications system 10 (FIG. 6) illustrated in FIGS. 10A, 10B, 10C, and 10D, the quadrature-phase test signal TSQ (FIG. 6) is phase-shifted from the in-phase test signal TSI (FIG. 6) by about 90 degrees and the quadrature-phase local oscillator signal LSQ is phase-shifted from the in-phase local oscillator signal LSI by about 90 degrees. The in-phase local oscillator signal LSI is about phase-aligned with the in-phase test signal TSI (FIG. 6). However, the quadrature-phase test signal TSQ (FIG. 6) is phase-shifted from the quadrature local oscillator signal QLS by about 180 degrees. The digital up-converter 42 (FIG. 6) provides the 180 degree phase-shift between the quadrature-phase test signal TSQ (FIG. 6) and the quadrature local oscillator signal QLS.

As such, the quadrature-phase test signal TSQ and the quadrature local oscillator signal QLS have counter-rotating IQ vectors. The counter-rotating IQ vectors allow the complex multiplier 60 (FIG. 9) to synchronously down-mix the quadrature local oscillator signal QLS (FIG. 9) and the quadrature test signal embedded in the quadrature down-converter output signal QDO (FIG. 9) to extract the complex gain of the transmit path 16 (FIG. 6) regardless of phase-alignment of the quadrature test signal and the quadrature local oscillator signal QLS (FIG. 6). Therefore, the processing delay that was previously discussed does not affect the synchronous down-mixing. However, alternative embodiments of the RF communications system 10 (FIG. 6) that do not incorporate counter-rotating IQ vectors may need to compensate for the effects of processing delay.

The in-phase down-converter output signal DOI and the quadrature-phase down-converter output signal DOQ both illustrate information that correlates with the in-phase local oscillator signal LSI and the quadrature-phase local oscillator signal LSQ, respectively. The correlating information in the in-phase down-converter output signal DOI and the quadrature-phase down-converter output signal DOQ is delayed from the in-phase local oscillator signal LSI and the quadrature-phase local oscillator signal LSQ due to the processing delay. As a result, in embodiments of the RF communications system 10 (FIG. 6) that do not incorporate counter-rotating IQ vectors, sampling by the quadrature ADC 58 may need to be delayed by a sample delay 74 to align the correlating information in the in-phase down-converter output signal DOI and the quadrature-phase down-converter output signal DOQ with the in-phase local oscillator signal LSI and the quadrature-phase local oscillator signal LSQ, respectively.

The in-phase down-converter output signal DOI and the quadrature-phase down-converter output signal DOQ have a sample period 76, which is about equal to a period of the quadrature local oscillator signal QLS. The in-phase down-converter output signal DOI and the quadrature-phase down-converter output signal DOQ are sampled four times per sample period 76. A first sample 78 of the in-phase down-converter output signal DOI and the quadrature-phase down-converter output signal DOQ is taken when the in-phase down-converter output signal DOI correlates to the positive in-phase amplitude peak 66. A second sample 80 of the in-phase down-converter output signal DOI and the quadrature-phase down-converter output signal DOQ is taken when the quadrature-phase down-converter output signal DOQ correlates to the positive quadrature-phase amplitude peak 70. A third sample 82 of the in-phase down-converter output signal DOI and the quadrature-phase down-converter output signal DOQ is taken when the in-phase down-converter output signal DOI correlates to the negative in-phase amplitude peak 68. A fourth sample 84 of the in-phase down-converter output signal DOI and the quadrature-phase down-converter output signal DOQ is taken when the quadrature-phase down-converter output signal DOQ correlates to the negative quadrature-phase amplitude peak 72.

The first sample 78 of the in-phase down-converter output signal DOI has a first sample in-phase magnitude 86. The first sample 78 of the quadrature-phase down-converter output signal DOQ has a first sample quadrature-phase magnitude 88. The second sample 80 of the in-phase down-converter output signal DOI has a second sample in-phase magnitude 90. The second sample 80 of the quadrature-phase down-converter output signal DOQ has a second sample quadrature-phase magnitude 92. The third sample 82 of the in-phase down-converter output signal DOI has a third sample in-phase magnitude 94. The third sample 82 of the quadrature-phase down-converter output signal DOQ has a third sample quadrature-phase magnitude 96. The fourth sample 84 of the in-phase down-converter output signal DOI has a fourth sample in-phase magnitude 98. The fourth sample 84 of the quadrature-phase down-converter output signal DOQ has a fourth sample quadrature-phase magnitude 100.

To simplify the complex multiplier 60 (FIG. 9), the quadrature leg amplitude 64 (FIG. 10A) is scaled to be 1. In one embodiment of the RF communications system 10 (FIG. 6), to simplify the complex multiplier 60 (FIG. 9), during multiplication of the digital quadrature down-converter signal DDO (FIG. 9) and the quadrature local oscillator signal QLS (FIG. 9), a magnitude of the in-phase local oscillator signal LSI is 1, 0, or −1 and a magnitude of the quadrature-phase local oscillator signal LSQ is 1, 0, or −1.

Returning to FIG. 9, the complex multiplier 60 performs a complex multiplication of the quadrature local oscillator signal QLS times the digital quadrature down-converter signal DDO to provide the quadrature complex multiplier output signal CMO. As such, in one embodiment of the RF communications system 10 (FIG. 6), the quadrature local oscillator signal QLS may be represented as LSI+jLSQ, the digital quadrature down-converter signal DDO may be represented as DDI+jDDQ, and the quadrature complex multiplier output signal CMO may be represented as CMI+jCMQ. Further, the first sample in-phase magnitude 86 is represented as "86". The first sample quadrature-phase magnitude 88 is represented as "88". The second sample in-phase magnitude 90 is represented as "90". The second sample quadrature-phase magnitude 92 is represented as "92". The third sample in-phase magnitude 94 is represented as "94". The third sample quadrature-phase magnitude 96 is represented as "96". The fourth sample in-phase magnitude 98 is represented as "98". The fourth sample quadrature-phase magnitude 100 is represented as "100".

In this regard, the table below shows magnitudes of the in-phase local oscillator signal LSI, the quadrature-phase local oscillator signal LSQ, the digital in-phase down-converter signal DDI, the digital quadrature-phase down-converter signal DDQ, the in-phase complex multiplier output signal CMI, and the quadrature-phase complex multiplier output signal CMQ during the four samples previously described. To simplify calculations, the quadrature leg amplitude 64 (FIG. 10A) is scaled to be 1.

| SAMPLE | LSI | LSQ | DDI | DDQ | CMI | CMQ |
|---|---|---|---|---|---|---|
| FIRST | 1 | 0 | "86" | "88" | "86" | "88" |
| SECOND | 0 | −1 | "90" | "92" | "−92" | "90" |
| THIRD | −1 | 0 | "94" | "96" | −"94" | −"96" |
| FOURTH | 0 | 1 | "98" | "100" | "100" | −"98" |

From the table, the in-phase complex multiplier output signal CMI and the quadrature-phase complex multiplier output signal CMQ are easily provided by the complex multiplier 60. In one embodiment of the complex multiplier 60, for the first sample, the complex multiplier 60 need only forward the digital in-phase down-converter signal DDI to provide the in-phase complex multiplier output signal CMI and forward the digital quadrature-phase down-converter signal DDQ to provide the quadrature-phase complex multiplier output signal CMQ.

For the second sample, the complex multiplier 60 need only negate and forward the digital quadrature-phase down-converter signal DDQ to provide the in-phase complex multiplier output signal CMI, and forward the digital in-phase down-converter signal DDI to provide the quadrature-phase complex multiplier output signal CMQ. For the third sample, the complex multiplier 60 need only negate and forward the digital in-phase down-converter signal DDI to provide the in-phase complex multiplier output signal CMI, and negate and forward the digital quadrature-phase down-converter signal DDQ to provide the quadrature-phase complex multiplier output signal CMQ. For the fourth sample, the complex multiplier 60 need only negate and forward the digital in-phase down-converter signal DDI to provide the quadrature-phase complex multiplier output signal CMQ, and forward the digital quadrature-phase down-converter signal DDQ to provide the in-phase complex multiplier output signal CMI.

FIGS. 11A, 11B, 11C, and 11D are graphs illustrating the in-phase local oscillator signal LSI, the quadrature-phase local oscillator signal LSQ, the in-phase down-converter output signal DOI, and the quadrature-phase down-converter output signal DOQ, respectively, shown in FIG. 9 according to an alternate embodiment of the RF communications system 10 (FIG. 6). The in-phase local oscillator signal LSI, the quadrature-phase local oscillator signal LSQ, the in-phase down-converter output signal DOI, and the quadrature-phase down-converter output signal DOQ illustrated in FIGS. 11A, 11B, 11C, and 11D are similar to the in-phase local oscillator signal LSI, the quadrature-phase local oscillator signal LSQ, the in-phase down-converter output signal DOI, and the quadrature-phase down-converter output signal DOQ illustrated in FIGS. 10A, 10B, 10C, and 10D, except the in-phase local oscillator signal LSI, the quadrature-phase local oscillator signal LSQ, the in-phase down-converter output signal DOI, and the quadrature-phase down-converter output signal DOQ illustrated in FIGS. 10A, 10B, 10C, and 10D are sinusoidal signals, whereas the in-phase local oscillator signal LSI, the quadrature-phase local oscillator signal LSQ, the in-phase down-converter output signal DOI, and the quadrature-phase down-converter output signal DOQ illustrated in FIGS. 11A, 11B, 11C, and 11D are square-wave signals.

As such, the in-phase test signal TSI (FIG. 6) is approximately a square wave and the quadrature-phase test signal TSQ (FIG. 6) is approximately a square wave. In one embodiment of the RF communications system 10 (FIG. 6) sampling by the quadrature ADC 58 (FIG. 9) is delayed by the sample delay 74 to allow a steady-state to be reached before sampling the quadrature down-converter output signal QDO (FIG. 9). In this regard, after each transition of the phase test signal TSI (FIG. 6) is and the quadrature-phase test signal TSQ (FIG. 6), multiplication of the digital quadrature down-converter signal DDO (FIG. 9) and the quadrature local oscillator signal QLS (FIG. 9) occurs after a steady-state of the digital quadrature down-converter signal DDO (FIG. 9) is reached.

In one embodiment of the complex multiplier 60 (FIG. 9), if the averaging circuitry 62 (FIG. 9) is not capable of accepting negative values, the complex multiplier 60 (FIG. 9) could add the four samples together to provide a sum to the averaging circuitry 62 (FIG. 9). In this regard, the complex multiplier 60 (FIG. 9) may be fairly simple. In one embodiment of the complex multiplier 60 (FIG. 9), the complex multiplier 60 (FIG. 9) is implemented in software running on a processor, such as a micro-controller. In an alternate embodiment of the complex multiplier 60 (FIG. 9), the complex multiplier 60 includes multiplexers, digital summing circuitry (FIG. 9), digital difference circuitry, and the like.

FIG. 12 illustrates a process for processing the in-phase down-converter output signal DOI and the quadrature-phase down-converter output signal DOQ illustrated in FIG. 9 according to one embodiment of the digital frequency converter 20 (FIG. 9). This process may be part of the frequency converting the quadrature down-converter output signal QDO to provide the averaged frequency converter output signal AFC (Step A14) illustrated in FIG. 5. The process describes adding the four samples together to provide a sum to the averaging circuitry 62 (FIG. 9).

The process begins by providing and clearing an in-phase register (not shown) and a quadrature-phase register (not shown)(Step B10). The in-phase register (not shown) and the quadrature-phase register (not shown) are part of the complex multiplier 60 (FIG. 9). The process continues by sampling the in-phase down-converter output signal DOI (FIG. 9) and the quadrature-phase down-converter output signal DOQ (FIG. 9) using the quadrature ADC 58 (FIG. 9) to obtain a first in-phase sample and a first quadrature-phase sample, respectively (Step B12). The process progresses by adding the first in-phase sample to the in-phase register and adding the first quadrature-phase sample to the quadrature-phase register (Step B14).

The process continues by sampling the in-phase down-converter output signal DOI (FIG. 9) and the quadrature-phase down-converter output signal DOQ (FIG. 9) using the quadrature ADC 58 (FIG. 9) to obtain a second in-phase sample and a second quadrature-phase sample, respectively (Step B16). The process progresses by adding the second in-phase sample to the quadrature-phase register and subtracting the second quadrature-phase sample from the in-phase register (Step B18).

The process continues by sampling the in-phase down-converter output signal DOI (FIG. 9) and the quadrature-phase down-converter output signal DOQ (FIG. 9) using the quadrature ADC 58 (FIG. 9) to obtain a third in-phase sample and a third quadrature-phase sample, respectively (Step B20). The process progresses by subtracting the third in-phase sample from the in-phase register and subtracting the third quadrature-phase sample from the quadrature-phase register (Step B22).

The process continues by sampling the in-phase down-converter output signal DOI (FIG. 9) and the quadrature-phase down-converter output signal DOQ (FIG. 9) using the quadrature ADC 58 (FIG. 9) to obtain a fourth in-phase sample and a fourth quadrature-phase sample, respectively (Step B24). The process progresses by subtracting the fourth in-phase sample from the quadrature-phase register and adding the fourth quadrature-phase sample to the in-phase register (Step B26).

The process concludes by forwarding contents of the in-phase register and the quadrature-phase register to the averaging circuitry 62 (FIG. 9) via the in-phase complex multiplier output signal CMI (FIG. 9) and the quadrature-phase complex multiplier output signal CMQ (FIG. 9), respectively (Step B28).

As previously mentioned, in one embodiment of the RF communications system 10 (FIG. 6), the quadrature test signal QTS (FIG. 6) is based on the quadrature local oscillator signal QLS (FIG. 6) and there is a processing delay from the quadrature local oscillator signal QLS (FIG. 9) to correlating information in the in-phase down-converter output signal DOI (FIG. 9) and the quadrature-phase down-converter output signal DOQ (FIG. 9). Therefore, in one embodiment of the quadrature ADC 58 (FIG. 9), sampling by the quadrature ADC 58 (FIG. 9) is delayed to compensate for the processing delay in the RF communications system 10 (FIG. 6). In this regard, sampling the in-phase down-converter output signal DOI (FIG. 9) and the quadrature-phase down-converter output signal DOQ (FIG. 9) is delayed to compensate for the processing delay from the quadrature local oscillator signal QLS (FIG. 9) to correlating information in the in-phase down-converter output signal DOI (FIG. 9) and the quadrature-phase down-converter output signal DOQ (FIG. 9).

FIG. 13 illustrates a process for processing the in-phase down-converter output signal DOI and the quadrature-phase down-converter output signal DOQ illustrated in FIG. 9 according to an alternate embodiment of the digital frequency converter 20 (FIG. 9). This process may be part of the frequency converting the quadrature down-converter output signal QDO to provide the averaged frequency converter output signal AFC (Step A14) illustrated in FIG. 5. This process describes adding multiple samples together to provide a sum to the averaging circuitry 62 (FIG. 9). In this regard, this process illustrated in FIG. 13 is a generalized version of the process illustrated in FIG. 12.

The process begins by providing and clearing an in-phase register (not shown) and a quadrature-phase register (not shown)(Step 010). The in-phase register (not shown) and the quadrature-phase register (not shown) are part of the complex multiplier 60 (FIG. 9). The process continues by sampling the in-phase down-converter output signal DOI (FIG. 9) and the quadrature-phase down-converter output signal DOQ (FIG. 9) using the quadrature ADC 58 (FIG. 9) to obtain an in-phase sample and a quadrature-phase sample, respectively (Step C12). The process progresses by adding or subtracting the in-phase sample to or from, respectively, one of the in-phase register and the quadrature-phase register (Step C14). The process continues by adding or subtracting the quadrature-phase sample to or from, respectively, another of the in-phase register and the quadrature-phase register (Step C16). The process proceeds by repeating the sampling the in-phase down-converter output signal DOI (FIG. 9) and the quadrature-phase down-converter output signal DOQ (FIG. 9), the adding or subtracting the in-phase sample, and the adding or subtracting the quadrature-phase sample, as necessary (Step C18). The process concludes by forwarding contents of the in-phase register and the quadrature-phase register to the averaging circuitry 62 (FIG. 9) via the in-phase complex multiplier output signal CMI (FIG. 9) and the quadrature-phase complex multiplier output signal CMQ (FIG. 9), respectively (Step C20).

Those skilled in the art will recognize improvements and modifications to the preferred embodiments of the present disclosure. All such improvements and modifications are considered within the scope of the concepts disclosed herein and the claims that follow.

What is claimed is:

1. Circuitry adapted to operate in one of a test mode and a normal operating mode, and comprising:
   an IQ to radio frequency modulator adapted to, during the test mode, modulate a quadrature radio frequency carrier signal using a quadrature test signal;
   a radio frequency to IQ down-converter adapted to, during the test mode, down-convert a down-converter radio frequency input signal to provide a quadrature down-converter output signal using the quadrature radio frequency carrier signal, such that the down-converter radio frequency input signal is based on the quadrature test signal and a complex gain of a transmit path; and
   a digital frequency converter adapted to, during the test mode, frequency convert the quadrature down-converter output signal to provide an averaged frequency converter output signal, which is a quadrature direct current signal that is representative of an amplitude and phase of the quadrature test signal and the complex gain of the transmit path, such that the quadrature down-converter output signal is synchronized to the quadrature test signal.

2. The circuitry of claim 1 wherein a measured complex gain of the transmit path is based on an amplitude of the quadrature test signal and a magnitude of the averaged frequency converter output signal.

3. The circuitry of claim 1 wherein the transmit path is an uplink path.

4. The circuitry of claim 1 wherein the IQ to radio frequency modulator is further adapted to, during the normal operating mode, radio frequency modulate the quadrature radio frequency carrier signal using a quadrature transmit signal to provide a radio frequency modulator output signal to the transmit path.

5. The circuitry of claim 4 wherein, during the normal operating mode, the radio frequency modulator output signal is processed and forwarded to a radio frequency antenna via the transmit path.

6. The circuitry of claim 1 wherein during the test mode:
   the quadrature test signal has an in-phase test signal and a quadrature-phase test signal;
   the in-phase test signal and the quadrature-phase test signal are both continuous wave signals;
   an amplitude of the quadrature-phase test signal is about equal to an amplitude of the in-phase test signal; and
   the quadrature-phase test signal is phase-shifted from the in-phase test signal by about 90 degrees.

7. The circuitry of claim 1 wherein the digital frequency converter comprises:
   a quadrature analog-to-digital converter adapted to, during the test mode, receive and analog-to-digital convert the quadrature down-converter output signal to provide a digital quadrature down-converter signal; and
   a complex multiplier adapted to, during the test mode, receive and multiply the digital quadrature down-converter signal and a quadrature local oscillator signal to provide a quadrature complex multiplier output signal, wherein multiplication of the digital quadrature down-converter signal and the quadrature local oscillator signal is a complex multiplication.

8. The circuitry of claim 7 wherein the digital frequency converter further comprises averaging circuitry adapted to, during the test mode, receive and average the quadrature complex multiplier output signal to provide the averaged frequency converter output signal.

9. The circuitry of claim 7 wherein the complex multiplier is further adapted to, during the test mode, function as a synchronous down-mixer of the quadrature test signal.

10. The circuitry of claim 7 wherein the complex multiplier is further adapted to, during the test mode, synchronize the quadrature down-converter output signal to the quadrature test signal.

11. The circuitry of claim 7 wherein:
the quadrature local oscillator signal has an in-phase local oscillator signal and a quadrature-phase local oscillator signal;
during the multiplication of the digital quadrature down-converter signal and the quadrature local oscillator signal, a magnitude of the in-phase local oscillator signal is equal to one of 1, 0, and −1; and
during the multiplication of the digital quadrature down-converter signal and the quadrature local oscillator signal, a magnitude of the quadrature-phase local oscillator signal is equal to one of 1, 0, and −1.

12. The circuitry of claim 7 wherein:
the quadrature local oscillator signal has an in-phase local oscillator signal and a quadrature-phase local oscillator signal;
the quadrature test signal has an in-phase test signal and a quadrature-phase test signal;
the quadrature-phase test signal is phase-shifted from the in-phase test signal by about 90 degrees;
the quadrature-phase local oscillator signal is phase-shifted from the in-phase local oscillator signal by about 90 degrees; and
the quadrature-phase test signal is phase-shifted from the quadrature-phase local oscillator signal by about 180 degrees.

13. The circuitry of claim 7 wherein:
the quadrature test signal has an in-phase test signal and a quadrature-phase test signal;
each of the in-phase test signal and the quadrature-phase test signal is approximately a square wave; and
after each transition of the in-phase test signal and the quadrature-phase test signal, the multiplication of the digital quadrature down-converter signal and the quadrature local oscillator signal occurs after a steady-state of the digital quadrature down-converter signal is reached.

14. A method for measuring a complex gain of a transmit path comprising:
modulating a quadrature radio frequency carrier signal using a quadrature test signal;
down-converting a down-converter radio frequency input signal to provide a quadrature down-converter output signal using the quadrature radio frequency carrier signal, such that the down-converter radio frequency input signal is based on the quadrature test signal and the complex gain of the transmit path;
frequency converting the quadrature down-converter output signal to provide an averaged frequency converter output signal, which is a quadrature direct current signal that is representative of an amplitude and phase of the quadrature test signal and the complex gain of the transmit path, such that the quadrature down-converter output signal is synchronized to the quadrature test signal; and
extracting the complex gain of the transmit path based on the amplitude and phase of the quadrature test signal and a magnitude and phase of the averaged frequency converter output signal.

15. The method of claim 14 wherein the frequency converting the quadrature down-converter output signal to provide the averaged frequency converter output signal comprises:
providing and clearing an in-phase register and a quadrature-phase register;
sampling an in-phase down-converter output signal and a quadrature-phase down-converter output signal using a quadrature analog-to-digital converter to obtain a first in-phase sample and a first quadrature-phase sample, respectively;
adding the first in-phase sample to the in-phase register and adding the first quadrature-phase sample to the quadrature-phase register;
sampling the in-phase down-converter output signal and the quadrature-phase down-converter output signal using the quadrature analog-to-digital converter to obtain a second in-phase sample and a second quadrature-phase sample, respectively;
adding the second in-phase sample to the quadrature-phase register and subtracting the second quadrature-phase sample from the in-phase register;
sampling the in-phase down-converter output signal and the quadrature-phase down-converter output signal using the quadrature analog-to-digital converter to obtain a third in-phase sample and a third quadrature-phase sample, respectively;
subtracting the third in-phase sample from the in-phase register and subtracting the third quadrature-phase sample from the quadrature-phase register;
sampling the in-phase down-converter output signal and the quadrature-phase down-converter output signal using the quadrature analog-to-digital converter to obtain a fourth in-phase sample and a fourth quadrature-phase sample, respectively;
subtracting the fourth in-phase sample from the quadrature-phase register and adding the fourth quadrature-phase sample to the in-phase register; and
forwarding contents of the in-phase register and the quadrature-phase register to averaging circuitry via an in-phase complex multiplier output signal and a quadrature-phase complex multiplier output signal, respectively.

16. The method of claim 15 wherein the frequency converting the quadrature down-converter output signal to provide the averaged frequency converter output signal further comprises receiving and averaging a quadrature complex multiplier output signal to provide the averaged frequency converter output signal, such that the averaged frequency converter output signal has the in-phase complex multiplier output signal and the quadrature-phase complex multiplier output signal.

17. The method of claim 14 wherein the frequency converting the quadrature down-converter output signal to provide the averaged frequency converter output signal comprises:
providing and clearing an in-phase register and a quadrature-phase register;
sampling an in-phase down-converter output signal and a quadrature-phase down-converter output signal using a quadrature analog-to-digital converter to obtain an in-phase sample and a quadrature-phase sample, respectively;
adding or subtracting the in-phase sample to or from, respectively, one of the in-phase register and the quadrature-phase register;

adding or subtracting the quadrature-phase sample to or from, respectively, another of the in-phase register and the quadrature-phase register;

repeating the sampling the in-phase down-converter output signal and the quadrature-phase down-converter output signal, the adding or subtracting the in-phase sample, and the adding or subtracting the quadrature-phase sample, as necessary; and forwarding contents of the in-phase register and the quadrature-phase register to averaging circuitry via an in-phase complex multiplier output signal and a quadrature-phase complex multiplier output signal, respectively.

18. The method of claim 17 wherein the frequency converting the quadrature down-converter output signal to provide the averaged frequency converter output signal further comprises receiving and averaging a quadrature complex multiplier output signal to provide the averaged frequency converter output signal, such that the averaged frequency converter output signal has the in-phase complex multiplier output signal and the quadrature-phase complex multiplier output signal.

19. Antenna facing circuitry configured to operate in one of a test mode and a normal operating mode, and comprising:

an IQ to radio frequency modulator configured to, during the test mode, modulate a quadrature radio frequency carrier signal using a quadrature test signal; and a radio frequency to IQ down-converter configured to, during the test mode, down-convert a down-converter radio frequency input signal to provide a quadrature down-converter output signal using the quadrature radio frequency carrier signal, such that the down-converter radio frequency input signal is based on the quadrature test signal and a complex gain of a transmit path, wherein baseband facing circuitry comprises a digital frequency converter configured to, during the test mode, frequency convert the quadrature down-converter output signal to provide an averaged frequency converter output signal, which is a quadrature direct current signal that is representative of an amplitude and phase of the quadrature test signal and the complex gain of the transmit path, such that the quadrature down-converter output signal is synchronized to the quadrature test signal.

20. The antenna facing circuitry of claim 19 wherein the baseband facing circuitry is configured to provide the quadrature test signal.

* * * * *

UNITED STATES PATENT AND TRADEMARK OFFICE
CERTIFICATE OF CORRECTION

PATENT NO.        : 9,178,627 B2
APPLICATION NO.   : 14/122852
DATED             : November 3, 2015
INVENTOR(S)       : Jean-Frederic Chiron It is certified that error appears in the above-identified patent and that said Letters Patent is hereby corrected as shown below:

Title Page, Item (57) in the abstract, line 3, replace "frequency modulator" with --frequency (RF) modulator--

In the Specification:

In column 4, line 48, replace "ODD" with --QDO--

In column 6, lines 45, 50, and 55, replace "ODD" with --QDO--

In column 6, line 47, replace "OTS" with --QTS--

In column 7, line 3, replace "(MO" with --QDO--

In column 10, line 55, replace "OTS" with --QTS--

In column 15, line 39, replace "Step 010" with --Step C10--

Signed and Sealed this
Twenty-eighth Day of June, 2016

Michelle K. Lee
*Director of the United States Patent and Trademark Office*